United States Patent
Lee et al.

(10) Patent No.: US 11,984,548 B2
(45) Date of Patent: May 14, 2024

(54) DISPLAY DEVICE

(71) Applicant: Samsung Display Co., LTD., Yongin-si (KR)

(72) Inventors: Won Ho Lee, Yongin-si (KR); Buem Joon Kim, Yongin-si (KR); Jong Hyuk Kang, Yongin-si (KR); Hyun Deok Im, Yongin-si (KR); Eun A Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 439 days.

(21) Appl. No.: 17/322,346

(22) Filed: May 17, 2021

(65) Prior Publication Data

US 2022/0085260 A1    Mar. 17, 2022

(30) Foreign Application Priority Data

Sep. 17, 2020  (KR) ........................ 10-2020-0120068

(51) Int. Cl.
*H01L 33/62* (2010.01)
*H01L 25/075* (2006.01)
*H01L 25/16* (2023.01)
*H01L 27/12* (2006.01)

(52) U.S. Cl.
CPC .......... *H01L 33/62* (2013.01); *H01L 25/0753* (2013.01); *H01L 25/167* (2013.01); *H01L 27/1244* (2013.01)

(58) Field of Classification Search
CPC ... H01L 33/62; H01L 25/0753; H01L 25/167; H01L 27/1244; H01L 27/1214
See application file for complete search history.

(56) References Cited

U.S. PATENT DOCUMENTS

| 9,570,425 | B2 | 2/2017 | Do |
| 10,707,377 | B2 | 7/2020 | Kim et al. |
| 10,943,947 | B2 * | 3/2021 | Im ........................ H01L 25/167 |
| 2017/0317228 | A1 | 11/2017 | Sung |
| 2017/0338372 | A1 | 11/2017 | Teraguchi et al. |
| 2020/0203587 | A1 | 6/2020 | Kim et al. |

FOREIGN PATENT DOCUMENTS

| KR | 10-1436123 | 11/2014 |
| KR | 10-1672781 | 11/2016 |
| KR | 10-2019-0122118 | 10/2019 |
| KR | 10-2020-0078398 | 7/2020 |
| KR | 10-2020-0085977 | 7/2020 |
| KR | 10-2020-0088962 | 7/2020 |
| KR | 10-2020-0098767 | 8/2020 |

OTHER PUBLICATIONS

International Search Report corresponding to International Application No. PCT/KR2021/010903 dated Nov. 29, 2021.

\* cited by examiner

*Primary Examiner* — David Vu
(74) *Attorney, Agent, or Firm* — KILE PARK REED & HOUTTEMAN PLLC

(57) ABSTRACT

A display device includes a plurality of pixels including alignment electrodes and light emitting elements disposed between the alignment electrodes, and the alignment electrodes including outer alignment electrodes and center alignment electrodes disposed between the outer alignment electrodes. A distance between the center alignment electrodes is different from a distance between the center alignment electrodes and the outer alignment electrodes.

28 Claims, 15 Drawing Sheets

DISPLAY DEVICE

CROSS-REFERENCE TO RELATED APPLICATION(S)

This application claims priority to and benefits of Korean Patent Application No. 10-2020-0120068 under 35 U.S.C. 119 §, filed on Sep. 17, 2020 in the Korean Intellectual Property Office, the entire contents of which are incorporated herein by reference.

BACKGROUND

1. Technical Field

The disclosure relates to a display device.

2. Description of the Related Art

In recent years, as interest in information displays is increasing, research and development for display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device capable of improving an alignment degree of light emitting elements and a uniformity degree of a light emission of each pixel.

An object of the disclosure is not limited to the above-described object, and other objects within the spirit and the scope of the disclosure will be clearly understood by those skilled in the art from the following description.

A display device may include a plurality of pixels including alignment electrodes and light emitting elements disposed between the alignment electrodes; and the alignment electrodes including outer alignment electrodes and center alignment electrodes disposed between the outer alignment electrodes, wherein a distance between the center alignment electrodes may be different from a distance between the center alignment electrodes and the outer alignment electrodes.

The distance between the center alignment electrodes may be less than a distance between the center alignment electrodes and the outer alignment electrodes.

The outer alignment electrodes may include a first outer alignment electrode and a second outer alignment electrode spaced apart from each other, the center alignment electrodes being disposed between the first outer alignment electrode and the second outer alignment electrode, and the center alignment electrodes may include a first center alignment electrode adjacent to the first outer alignment electrode; and a second center alignment electrode adjacent to the second outer alignment electrode.

A distance between the first outer alignment electrode and the first center alignment electrode may be substantially same as a distance between the second outer alignment electrode and the second center alignment electrode.

A distance between the first center alignment electrode and the first outer alignment electrode may be greater than a distance between the first center alignment electrode and the second center alignment electrode.

A distance between the second center alignment electrode and the second outer alignment electrode may be greater than a distance between the second center alignment electrode and the first center alignment electrode.

The display device may further include a bank partitioning an emission area of the plurality of pixels.

The first outer alignment electrode may be disposed between the bank and the first center alignment electrode.

The second outer alignment electrode may be disposed between the bank and the second center alignment electrode.

The display device may further include contact electrodes electrically connecting the alignment electrodes and the light emitting elements.

The outer alignment electrodes may include a first outer alignment electrode and a second outer alignment electrode spaced apart from each other, the center alignment electrodes being disposed between the first outer alignment electrode and the second outer alignment electrode, and the center alignment electrodes may include a first center alignment electrode adjacent to the first outer alignment electrode; a second center alignment electrode adjacent to the second outer alignment electrode; and a third center alignment electrode disposed between the first center alignment electrode and the second center alignment electrode.

A distance between the first outer alignment electrode and the first center alignment electrode may be substantially same as a distance between the second outer alignment electrode and the third center alignment electrode.

A distance between the first outer alignment electrode and the first center alignment electrode may be greater than a distance between the first center alignment electrode and the second center alignment electrode.

The distance between the first center alignment electrode and the second center alignment electrode may be substantially same as a distance between the second center alignment electrode and the third center alignment electrode.

A display device may include a plurality of pixels each including a first alignment electrode, a second alignment electrode, a third alignment electrode, and a fourth alignment electrode disposed on a substrate; and light emitting elements disposed between the first alignment electrode, the second alignment electrode, the third alignment electrode, and the fourth alignment electrode, wherein a distance between the first alignment electrode and the second alignment electrode may be different from a distance between the second alignment electrode and the third alignment electrode.

The distance between the second alignment electrode and the third alignment electrode may be different from a distance between the third alignment electrode and the fourth alignment electrode.

The distance between the first alignment electrode and the second alignment electrode may be greater than the distance between the second alignment electrode and the third alignment electrode.

A distance between the third alignment electrode and the fourth alignment electrode may be greater than the distance between the second alignment electrode and the third alignment electrode.

The distance between the first alignment electrode and the second alignment electrode may be substantially same as a distance between the third alignment electrode and the fourth alignment electrode.

The display device may further include a bank partitioning an emission area of the plurality of pixels.

The first alignment electrode may be disposed between the bank and the second alignment electrode.

The fourth alignment electrode may be disposed between the bank and the third alignment electrode.

The light emitting elements may include a first light emitting element disposed between the first alignment electrode and the second alignment electrode; a second light emitting element disposed between the second alignment electrode and the third alignment electrode; and a third light emitting element disposed between the third alignment electrode and the fourth alignment electrode.

The display device may further include a first contact electrode electrically connecting an end of the first light emitting element and the first alignment electrode; and a second contact electrode electrically connecting another end of the first light emitting element and the second alignment electrode.

The display device may further include a first contact electrode overlapping the first alignment electrode; a second contact electrode overlapping the second alignment electrode; and a third contact electrode overlapping the third alignment electrode; and a width of the first contact electrode may be greater than a width of the second contact electrode.

A distance between the first contact electrode and the second contact electrode may be substantially the same as a distance between the second contact electrode and the third contact electrode.

The display device may further include a first contact electrode overlapping the first alignment electrode; a second contact electrode overlapping the second alignment electrode; and a third contact electrode overlapping the third alignment electrode; and a width of the first contact electrode may be substantially same as a width of the second contact electrode.

A distance between the first contact electrode and the second contact electrode may be greater than a distance between the second contact electrode and the third contact electrode.

Details of other embodiments are included in the detailed description and drawings.

According to an embodiment, a uniform electric field may be formed by compensating for an electric field difference in an emission area by forming a relatively narrow distance between alignment electrodes disposed at a center in the emission area. Accordingly, an alignment degree of the light emitting elements and a uniformity degree of light emission of each pixel may be improved.

Effects according to embodiments is not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
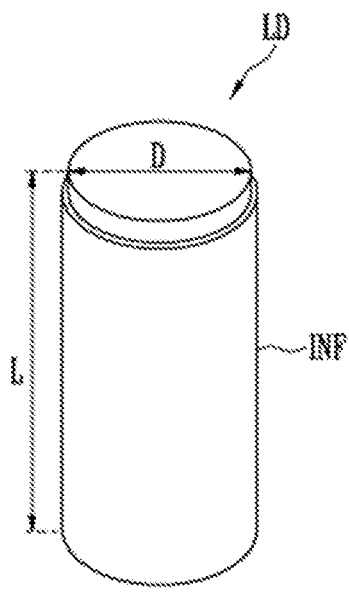
FIGS. 1 and 2 are perspective and schematic cross-sectional views illustrating a light emitting element according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and so that those skilled in the art to which the disclosure pertains can fully understand the scope of the disclosure.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The term used in the specification is for describing embodiments and is not intended to limit the disclosure. In the specification, the singular form also includes the plural form unless otherwise specified. The terms "comprises" and/or "comprising", "includes," and/or "including,", "has," "have," and/or "having," and variations thereof do not exclude the presence or addition of one or more other components, steps, operations, and/or elements to the described component, step, operation, and/or element.

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote to the same components throughout the specification.

Although the terms a first, a second, and the like are used to describe various components, these components are not limited by these terms. These terms are used only to distinguish one component from another component. Therefore, a first component described below may be a second component within the spirit and the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure are described in detail with reference to the accompanying drawings.

Figure 2:
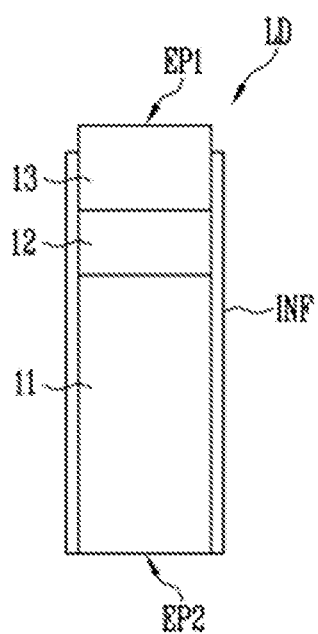

FIGS. 1 and 2 are perspective and schematic cross-sectional views illustrating a light emitting element according to an embodiment. FIGS. 1 and 2 show a column shape light emitting element LD, a type and/or a shape of the light emitting element LD are/is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, in a case that an extension direction of the light emitting element LD is a length L direction, the light emitting element LD may include the first semiconductor layer 11, the active layer 12, and the second semiconductor layer 13 sequentially stacked each other along the length L direction.

The light emitting element LD may be provided or disposed in a column shape extending along one or a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD.

According to an embodiment, the light emitting element LD may be a light emitting element manufactured in a column shape through an etching method or the like within the spirit and the scope of the disclosure. In the specification, the column shape may include a substantially rod-like shape or a substantially bar-like shape that may be long in the length L direction (for example, an aspect ratio is greater than 1), such as a substantially circular column or a substantially polygonal column, and the shape of the cross-section thereof is not particularly limited. For example, the length L of the light emitting element LD may be greater than a diameter D (or a width of a cross section).

The light emitting element LD may have a size as small as a nanometer scale to a micrometer scale. For example, each light emitting element LD may have the diameter D (or width) and/or the length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device.

The first semiconductor layer 11 may be a semiconductor layer of a first conductivity type. For example, the first semiconductor layer 11 may include an N-type semiconductor layer. For example, the first semiconductor layer 11 may include any one of InAlGaN, GaN, AlGaN, InGaN, AlN, and InN, and may include an N-type semiconductor layer doped with a first conductivity type dopant such as Si, Ge, and Sn. However, the material forming the first semiconductor layer 11 is not limited thereto, and the first semiconductor layer 11 may be formed of various other materials.

The active layer 12 may be disposed on the first semiconductor layer 11 and may be formed in a single quantum well or multi-quantum well structure. A position of the active layer 12 may be variously changed according to the type of the light emitting element LD.

A clad layer (not shown) doped with a conductive dopant may be formed or disposed on and/or under or below the active layer 12. For example, the clad layer may be formed of an AlGaN layer or an InAlGaN layer. According to an embodiment, a material of AlGaN, InAlGaN, or the like may be used to form the active layer 12, and various other materials may form the active layer 12.

The second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material among InAlGaN, GaN, AlGaN, InGaN, AlN, and InN, and may include a P-type semiconductor layer doped with a second conductivity type dopant such as Mg. However, the material forming the second semiconductor layer 13 is not limited thereto, and various other materials may form the second semiconductor layer 13.

In a case that a voltage equal to or greater than a threshold voltage is applied to both ends of the light emitting element LD, an electron-hole pair is combined in the active layer 12 and thus the light emitting element LD emits light. By controlling light emission of the light emitting element LD using such a principle, the light emitting element LD may be used as a light source of various light emitting devices including a pixel of a display device.

The light emitting element LD may further include an insulating film INF provided or disposed on a surface. The insulating film INF may be formed on the surface of the light emitting element LD to surround an outer circumferential surface of at least active layer 12, and may further surround one or a region of the first and second semiconductor layers 11 and 13.

According to an embodiment, the insulating film INF may expose the both ends of the light emitting element LD having different polarities. For example, the insulating film INF may expose one or an end of each of the first and second semiconductor layers 11 and 13 positioned at the first and second end portions EP1 and EP2 of the light emitting element LD. In an embodiment, the insulating film INF may expose a side portion of the first and second semiconductor layers 11 and 13 adjacent to the first and second end portions EP1 and EP2 of the light emitting element LD having different polarities.

According to an embodiment, the insulating film INF may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), and may be formed of a single layer or multiple layers (for example, a double layer formed of aluminum oxide ($AlO_x$) and silicon oxide ($SiO_x$)), but is not limited thereto. According to an embodiment, the insulating film INF may be omitted.

In a case that the insulating film INF may be provided or disposed to cover or overlap a surface of the light emitting element LD, for example, an outer surface of the active layer 12, a short between the active layer 12 and a first pixel electrode, a second pixel electrode, or the like to be described later may be prevented. Accordingly, electrical stability of the light emitting element LD may be secured.

For example, in a case that the insulating film INF may be provided or disposed on the or a surface of the light emitting element LD, a surface defect of the light emitting element LD may be minimized, thereby improving life and efficiency. For example, also in a case where a plurality of light emitting elements LD are disposed in close contact with each other, an unwanted short circuit between the light emitting elements LD may be prevented.

In an embodiment, the light emitting element LD may further include an additional component for example to the first semiconductor layer 11, the active layer 12, the second semiconductor layer 13, and/or the insulating film INF surrounding them. For example, the light emitting element LD may further include at least one phosphor layer, an active layer, a semiconductor layer and/or an electrode layer disposed on one or an end side of the first semiconductor layer 11, the active layer 12 and/or the second semiconductor layer 13. For example, the light emitting element LD may further include an electrode layer disposed on the second semiconductor layer 13. The electrode layer may include a metal or metal oxide, and for example, ITO, IZO, ITZO, Cr, Ti, Al, Au, Ni, an oxide or an alloy thereof, or the like may be used alone or in combination. According to an embodiment, the electrode layer may be further disposed on the first semiconductor layer 11.

Although the column shape light emitting element LD is shown in FIGS. 1 and 2, the type, structure and/or shape of the light emitting element LD may be variously changed. For example, the light emitting element LD may be formed in a core-shell structure having a substantially polygonal cone shape.

A light emitting device including the light emitting element LD described above may be used in various types of devices that require a light source, including a display device. For example, a plurality of light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
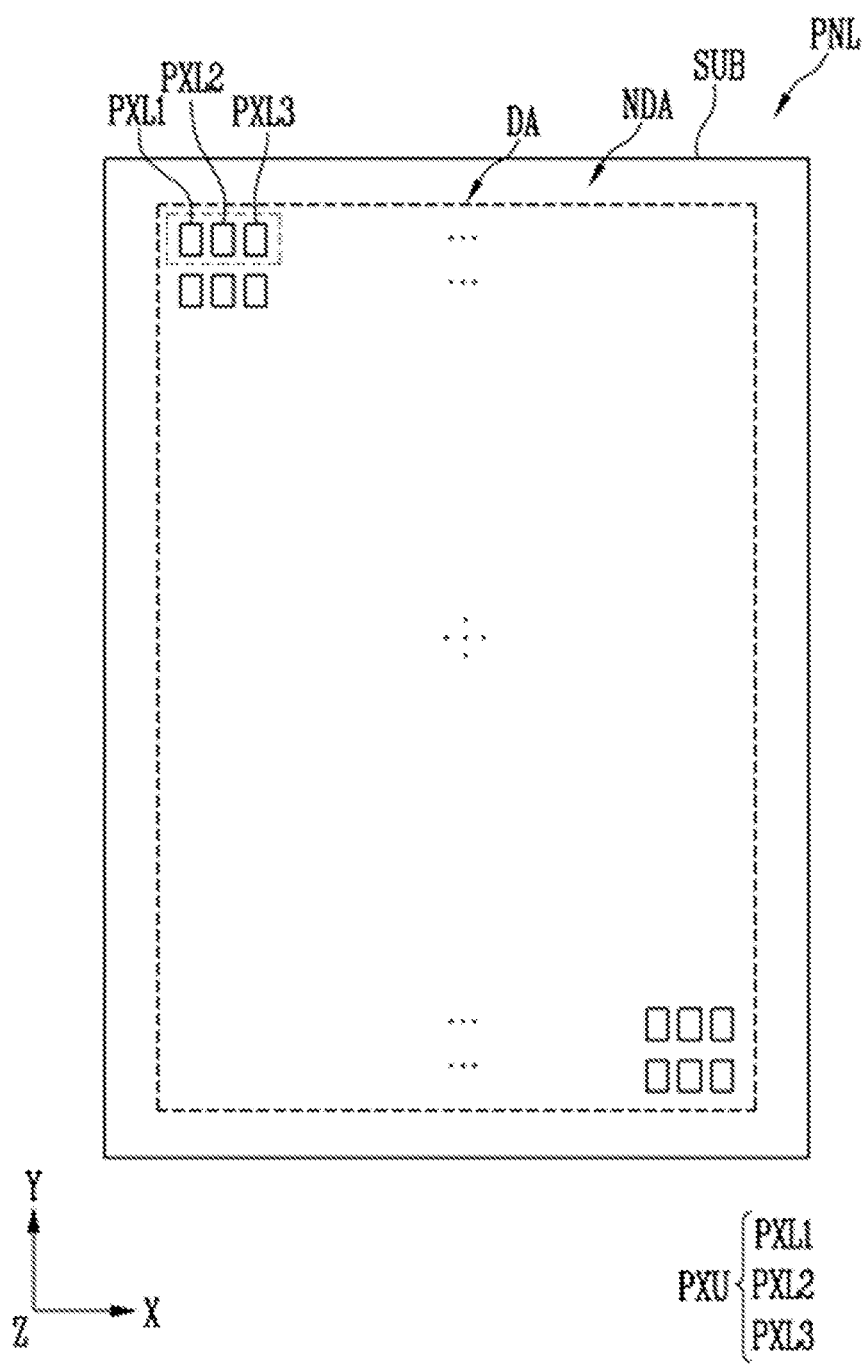
FIG. 3 is a plan view illustrating a display device according to an embodiment.

FIG. 3 is a plan view illustrating a display device according to an embodiment.

In FIG. 3, as an example of an electronic device that may use the light emitting element LD described in the embodiments of FIGS. 1 and 2 as a light source, a display device, for example, a display panel PNL provided or disposed in the display device is shown.

Each pixel unit PXU of the display panel PNL and each pixel forming the each pixel unit PXU may include at least one light emitting element LD. For convenience, in FIG. 3, a structure of the display panel PNL is shown based on a display area DA. However, according to an embodiment, at least one driving circuit unit (for example, at least one of a scan driver and a data driver), lines, and/or pads, which are/is not shown, may be further disposed on the display panel PNL.

Referring to FIG. 3, the display panel PNL may include a substrate SUB and a pixel unit PXU disposed on the substrate SUB. The pixel unit PXU may include first pixels PXL1, second pixels PXL2, and/or third pixels PXL3. Hereinafter, in a case that at least one pixel among the first pixels PXL1, the second pixels PXL2, and the third pixels PXL3 is arbitrarily referred to, or in a case that two or more types of pixels are collectively referred to, at least one or two or more types of pixels may be referred to as a "pixel (PXL)" or "pixels PXL".

The substrate SUB may form a base member of the display panel PNL, and may be a rigid or flexible substrate or film. For example, the substrate SUB may be a rigid substrate formed of glass or tempered glass, a flexible substrate (or a thin film) formed of plastic or metal, or an insulating layer of at least one layer. The material and/or a material property of the substrate SUB are/is not particularly limited.

In an embodiment, the substrate SUB may be substantially transparent. Here, "substantially transparent" may mean that light may be transmitted at a predetermined transmittance or more. In an embodiment, the substrate SUB may be translucent or opaque. For example, the substrate SUB may include a reflective material according to an embodiment.

The display panel PNL and the substrate SUB for forming the display panel PNL may include the display area DA for displaying an image and a non-display area NDA except for the display area DA.

The pixels PXL may be disposed in the display area DA. Various lines, pads, and/or a built-in circuit unit electrically connected to the pixels PXL of the display area DA may be disposed in the non-display area NDA. The pixels PXL may be regularly arranged or disposed according to a stripe or PenTile® arrangement structure, or the like within the spirit and the scope of the disclosure. However, the arrangement structure of the pixels PXL is not limited thereto, and the pixels PXL may be arranged or disposed in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged or disposed. At least one of the first to third pixels PXL1, PXL2, and PXL3 arranged or disposed to be adjacent to each other may form one pixel unit PXU capable of emitting light of various colors. For example, each of the first to third pixels PXL1, PXL2, and PXL3 may be a sub pixel emitting light of a predetermined color. According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. In an embodiment, the first pixel PXL1, the second pixel PXL2, and the third pixel PXL3 may include light emitting elements that emit light of the same color, and may include a color conversion layer and/or a color filter of different colors disposed on the respective light emitting element, to emit light of the first color, the second color, and the third color, respectively. However, the color, type, number, and/or the like of pixels PXL forming each pixel unit PXU are/is not particularly limited. For example, the color of light emitted by each pixel PXL may be variously changed.

The pixel PXL may include at least one light source driven by a predetermined control signal (for example, a scan signal and a data signal) and/or predetermined power (for example, first power and second power). In an embodiment, the light source may include at least one light emitting element LD according to any one of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

Figure 4:
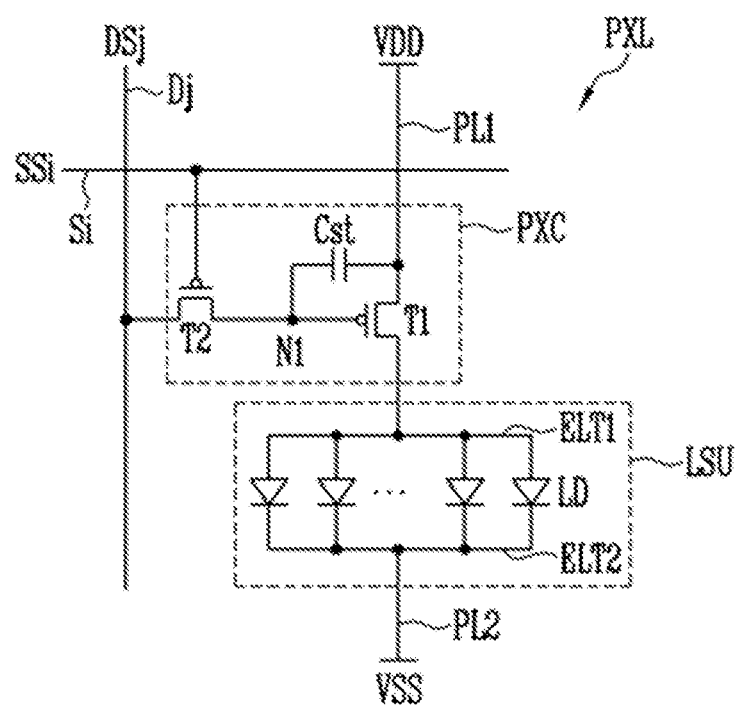
FIGS. 4 to 6 are equivalent circuit diagrams illustrating a pixel according to an embodiment.
Figure 5:
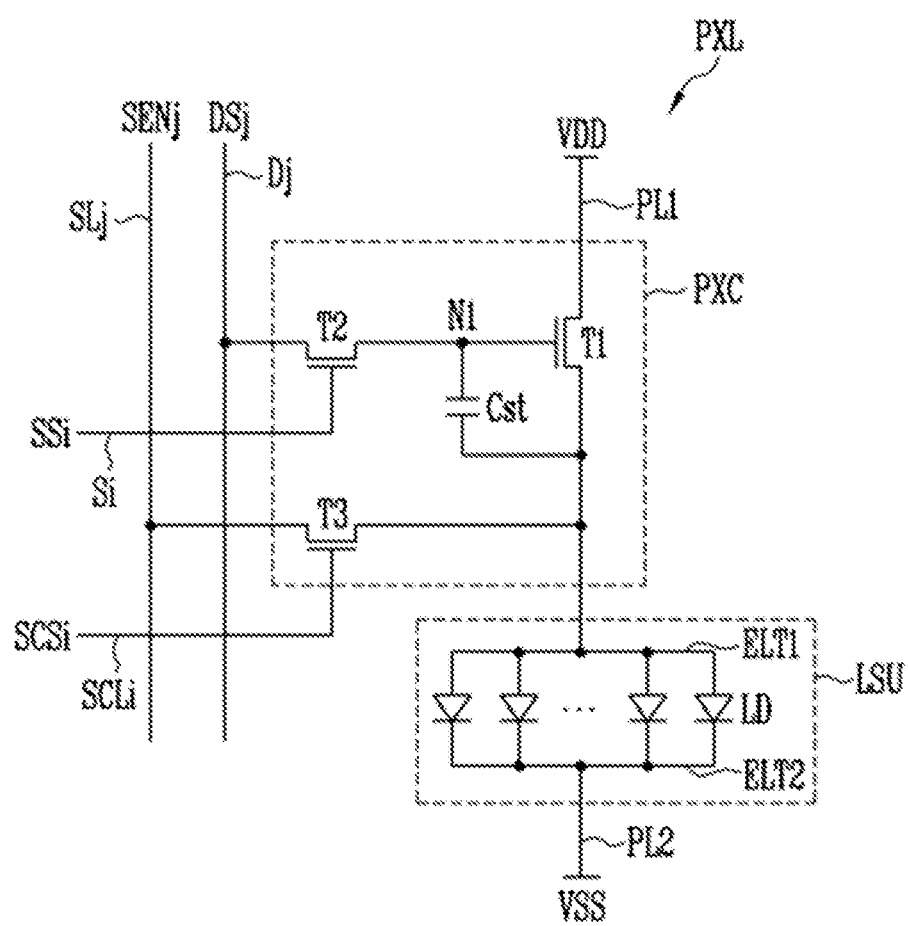
Figure 6:
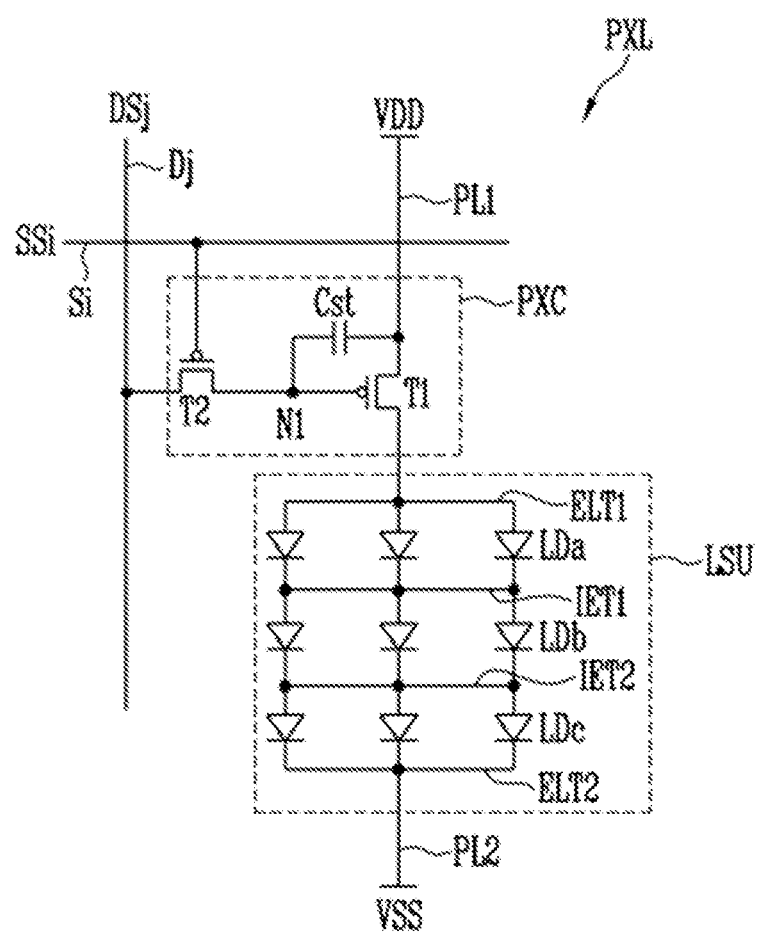

FIGS. 4 to 6 are equivalent circuit diagrams illustrating a pixel according to an embodiment.

For example, FIGS. 4 to 6 illustrate an embodiment of the pixel PXL applicable to an active display device. However, types of the pixel PXL and the display device are not limited thereto.

According to an embodiment, the pixel PXL shown in FIGS. 4 to 6 may be any one of the first to third pixels PXL1, PXL2, and PXL3 provided or disposed in the display panel PNL of FIG. 3, for example. The first to third pixels PXL1, PXL2, and PXL3 may have a structure substantially the same as or similar to each other.

Referring to FIG. 4, the pixel PXL may include a light source unit LSU for generating light having a luminance corresponding to a data signal, and a pixel circuit PXC for driving the light source unit LSU.

The light source unit LSU may include at least one light emitting element LD electrically connected between first power VDD and second power VSS. For example, the light source unit LSU may include a first electrode ELT1 (also referred to as a "first pixel electrode" or a "first alignment electrode") electrically connected to the first power VDD via the pixel circuit PXC and a first power line PL1, a second electrode ELT2 (also referred to as a "second pixel electrode" or a "second alignment electrode") electrically connected to the second power VSS through a second power line PL2, a plurality of light emitting elements LD electrically connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a P-type end portion) electrically connected to the first power VDD through the first electrode ELT1 and/or the pixel circuit PXC, and a second end portion (for example, an N-type end portion) electrically connected to the second power VSS through the second electrode ELT2. For example, the light emitting elements LD may be electrically connected in parallel in a forward direction between the first and second electrodes ELT1 and ELT2. Each light emitting element LD electrically connected in the forward direction between the first power VDD and the second power VSS may form each effective light source, and the effective light sources may be gathered to form the light source unit LSU of the pixel PXL.

The first power VDD and the second power VSS may have different potentials so that the light emitting elements LD may emit light. For example, the first power VDD may be set as high potential power, and the second power VSS may be set as low potential power. At this time, a potential difference between the first power VDD and the second power VSS may be set to be equal to or greater than a threshold voltage of the light emitting elements LD during an emission period of the pixel PXL.

One or an end portion (for example, the P-type end portion) of the light emitting elements LD forming each light source unit LSU may be commonly electrically connected to the pixel circuit PXC through one electrode (for example, the first electrode ELT1 of each pixel PXL) of the light source unit LSU, and may be electrically connected to the first power VDD through the pixel circuit PXC and the first power line PL1. Another end portion (for example, the N-type end portion) of the light emitting elements LD may be commonly electrically connected to the second power VSS through another electrode (for example, the second electrode ELT2 of each pixel PXL) of the light source unit LSU and the second power line PL2.

The light emitting elements LD may emit light at a luminance corresponding to a driving current supplied through the pixel circuit PXC. For example, during each frame period, the pixel circuit PXC may supply a driving current corresponding to a grayscale value to be expressed in a corresponding frame to the light source unit LSU. The driving current supplied to the light source unit LSU may be divided and flow to the light emitting elements LD electrically connected in the forward direction. Accordingly, while each light emitting element LD emits light at a luminance corresponding to the current flowing therethrough, the light source unit LSU may emit light of the luminance corresponding to the driving current.

The pixel circuit PXC may be electrically connected between the first power VDD and the first electrode ELT1. The pixel circuit PXC may be electrically connected to a scan line Si and a data line Dj of a corresponding pixel PXL. For example, in a case that the pixel PXL is disposed on an i-th (i is a natural number) horizontal line (row) and a j-th (j is a natural number) vertical line (column) of the display area DA, the pixel circuit PXC of the pixel PXL may be electrically connected to an i-th scan line Si and a j-th data line Dj of the display area DA.

According to an embodiment, the pixel circuit PXC may include a plurality of transistors and at least one capacitor. For example, the pixel circuit PXC may include a first transistor T1, a second transistor T2, and a storage capacitor Cst.

The first transistor T1 may be electrically connected between the first power VDD and the light source unit LSU. For example, a first electrode (for example, a source electrode) of the first transistor T1 may be electrically connected to the first power VDD, and a second electrode (for example, a drain electrode) of the first transistor T1 may be electrically connected to the first electrode ELT1. A gate electrode of the first transistor T1 may be electrically connected to a first node N1. The first transistor T1 controls the driving current supplied to the light source unit LSU in correspondence with a voltage of the first node N1. For example, the first transistor T1 may be a driving transistor that controls the driving current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. A gate electrode of the second transistor T2 may be electrically connected to the scan line Si. The second transistor T2 may be turned on when a scan signal SSi of a gate-on voltage (for example, a low level voltage) is supplied from the scan line Si, to electrically connect the data line Dj and the first node N1.

In each frame period, a data signal DSj of a corresponding frame is supplied to the data line Dj, and the data signal DSj is transferred to the first node N1 through the second transistor T2 which is turned on during a period in which the scan signal SSi of the gate-on voltage is supplied. For example, the second transistor T2 may be a switching transistor for transferring each data signal DSj to an inside of the pixel PXL.

One or an electrode of the storage capacitor Cst may be electrically connected to the first power VDD, and another electrode may be electrically connected to the first node N1. The storage capacitor Cst charges a voltage corresponding to the data signal DSj supplied to the first node N1 during each frame period.

In FIG. 4, all transistors included in the pixel circuit PXC, for example, the first and second transistors T1 and T2 are P-type transistors, but are not limited thereto, and at least one of the first and second transistors T1 and T2 may be changed to an N-type transistor. For example, the pixel circuit PXC may be formed with a pixel circuit of various structures and/or driving methods.

Referring to FIG. 5, the pixel circuit PXC may be further electrically connected to a sensing control line SCLi and a sensing line SLj. For example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. As another example, in an embodiment, the sensing line SLj may be omitted, and a characteristics of the pixel PXL may be detected by detecting a sensing signal SENj through the data line Dj of a corresponding pixel PXL (or an adjacent pixel).

The third transistor T3 may be electrically connected between the first transistor T1 and the sensing line SLj. For example, one electrode of the third transistor T3 may be electrically connected to the one electrode (for example, the source electrode) of the first transistor T1 electrically connected to the first electrode ELT1, and another electrode of the third transistor T3 may be electrically connected to the sensing line SLj. When the sensing line SLj is omitted, the other electrode of the third transistor T3 may be connected to the data line Dj.

A gate electrode of the third transistor T3 may be electrically connected to the sensing control line SCLi. When the sensing control line SCLi is omitted, the gate electrode of the third transistor T3 may be electrically connected to the scan line Si. The third transistor T3 is turned on by a sensing control signal SCSi of a gate-on voltage (for example, a high level voltage) supplied to the sensing control line SCLi during a predetermined sensing period, to electrically connect the sensing line SLj and the first transistor T1.

According to an embodiment, the sensing period may be a period for extracting the characteristic (for example, a threshold voltage or the like of the first transistor T1) of each of the pixels PXL disposed in the display area DA. During the sensing period, the first transistor T1 may be turned on by supplying a predetermined reference voltage that may turn on the first transistor T1 to the first node N1 through the data line Dj and the second transistor T2 or electrically connecting each pixel PXL to a current source or the like within the spirit and the scope of the disclosure. For example, the first transistor T1 may be electrically connected to the sensing line SLj by turning on the third transistor T3 by supplying the sensing control signal SCSi of the gate-on voltage to the third transistor T3. Thereafter, the sensing signal SENj may be obtained through the sensing line SLj, and the characteristic of each pixel PXL, including the threshold voltage of the first transistor T1, may be detected using the sensing signal SENj. Information on the characteristic of each pixel PXL may be used to convert image data so that a characteristic deviation between the pixels PXL disposed in the display area DA may be compensated.

In FIG. 5, an embodiment in which all of the first, second, and third transistors T1, T2, and T3 are N-type transistors is disclosed, but is not limited thereto. For example, at least one of the first, second, and third transistors T1, T2, and T3 may be changed to a P-type transistor.

For example, FIGS. 4 and 5 show an embodiment in which all effective light sources forming each light source unit LSU, for example, the light emitting elements LD, may be electrically connected in parallel, but the embodiment is not limited thereto. For example, as shown in FIG. 6, the light source unit LSU of each pixel PXL may be formed to include at least two stages of series structure. In describing an embodiment of FIG. 6, a detailed description of a configuration (for example, the pixel circuit PXC) similar to or identical to that of the embodiments of FIGS. 4 and 5 is omitted.

Referring to FIG. 6, the light source unit LSU may include at least two light emitting elements electrically connected in series with each other. For example, the light source unit LSU may include a first light emitting element LDa, a second light emitting element LDb, and a third light emitting element LDc electrically connected in series in a forward direction between the first power VDD and the second power VSS. The first, second, and third light emitting elements LDa, LDb, and LDc may form each effective light source.

Hereinafter, in a case that a light emitting element is referred to among the first, second, and third light emitting elements LDa, LDb, and LDc, a corresponding light emitting element is referred to as the "first light emitting element LDa", the "second light emitting element LDb", or the "third light emitting element LDc". For example, in a case that at least one of the first, second, and third light emitting elements LDa, LDb, and LDc is arbitrarily referred to or the first, second, and third light emitting elements LDa, LDb, and LDc are collectively referred to, at least one of the first, second, and third light emitting elements LDa, LDb, and LDc or the first, second, and third light emitting elements LDa, LDb, and LDc are referred to as the "light emitting element LD" or the "light emitting elements LD".

A first end portion (for example, a P-type end portion) of the first light emitting element LDa may be electrically connected to the first power VDD via the first electrode ELT1 (for example, the first pixel electrode) of the light source unit LSU. For example, a second end portion (for example, an N-type end portion) of the first light emitting element LDa may be electrically connected to a first end portion (for example, a P-type end portion) of the second light emitting element LDb through a first intermediate electrode IET1.

The first end portion of the second light emitting element LDb may be electrically connected to the second end portion of the first light emitting element LDa. For example, a second end portion (for example, an N-type end portion) of the second light emitting element LDb may be electrically connected to a first end portion (for example, a P-type end portion) of the third light emitting element LDc through a second intermediate electrode IET2.

The first end portion of the third light emitting element LDc may be electrically connected to the second end portion of the second light emitting element LDb. For example, a second end portion (for example, an N-type end portion) of the third light emitting element LDc may be electrically connected to the second power VSS via the second electrode ELT2 (for example, the second pixel electrode) or the like of the light source unit LSU. In the above-described method, the first, second, and third light emitting elements LDa, LDb, and LDc may be sequentially electrically connected in series between the first and second electrodes ELT1 and ELT2 of the light source unit LSU.

In FIG. 6, an embodiment in which the light emitting elements LD may be electrically connected in a three stage series structure is shown, but is not limited thereto, and the two light emitting elements LD may be electrically connected in a two stage series structure, or four or more light emitting elements LD may be electrically connected in a four or more stage series structure.

Assuming that the same luminance is expressed using the light emitting elements LD of the same condition (for example, the same size and/or number), in the light source unit LSU of a structure in which the light emitting elements LD may be electrically connected in series, a voltage applied between the first and second electrodes ELT1 and ELT2 may increase and a magnitude of the driving current flowing through the light source unit LSU may decrease compared to the light source unit LSU of a structure in which the light emitting elements LD may be electrically connected in parallel. Therefore, in a case that the light source unit LSU of each pixel PXL may be formed by applying the series structure, a panel current flowing through the display panel PNL may be reduced.

As in the above-described embodiments, each light source unit LSU may include the plurality of light emitting elements LD electrically connected in the forward direction between the first power VDD and the second power VSS and forming each effective light source. For example, the electrical connection structure between the light emitting elements LD may be variously changed according to an embodiment. For example, the light emitting elements LD may be electrically connected only in series or parallel to each other, or may be electrically connected in a series/parallel mixed structure.

In FIG. 6, all of the first and second transistors T1 and T2 included in the pixel circuit PXC are P-type transistors, but are not limited thereto. For example, at least one of the first and second transistors T1 and T2 may be changed to an N-type transistor. For example, the pixel circuit PXC may be formed with pixel circuits of various structures and/or driving methods.

Figure 7:
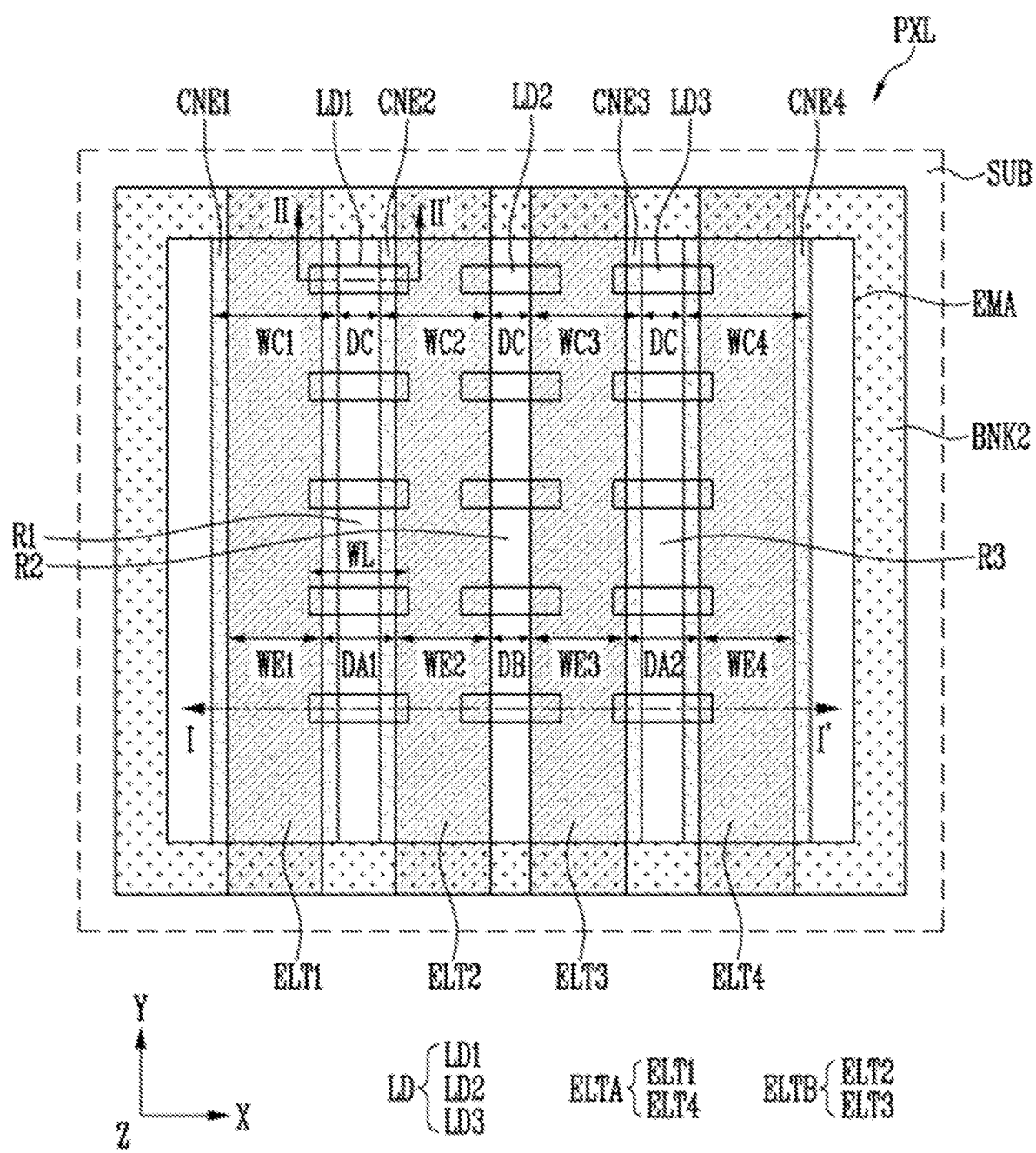
FIG. 7 is a plan view illustrating a pixel according to an embodiment.
Figure 8:
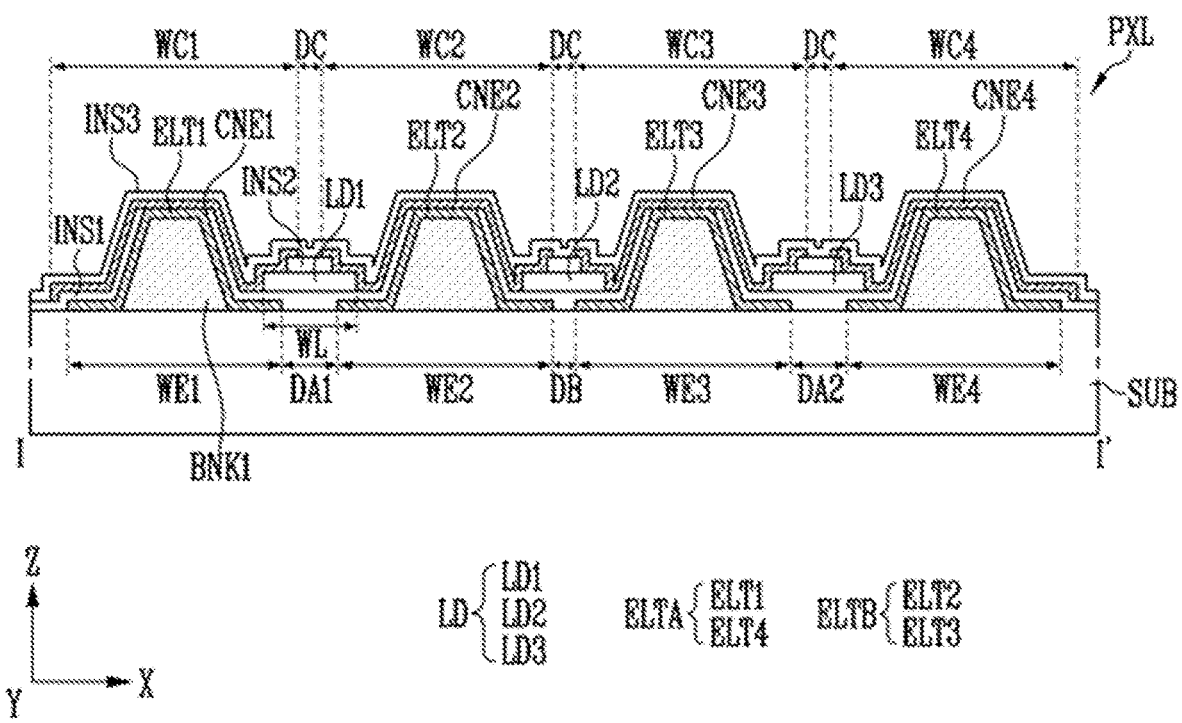
FIG. 8 is a schematic cross-sectional view taken along a line I-I' of FIG. 7.
Figure 9:
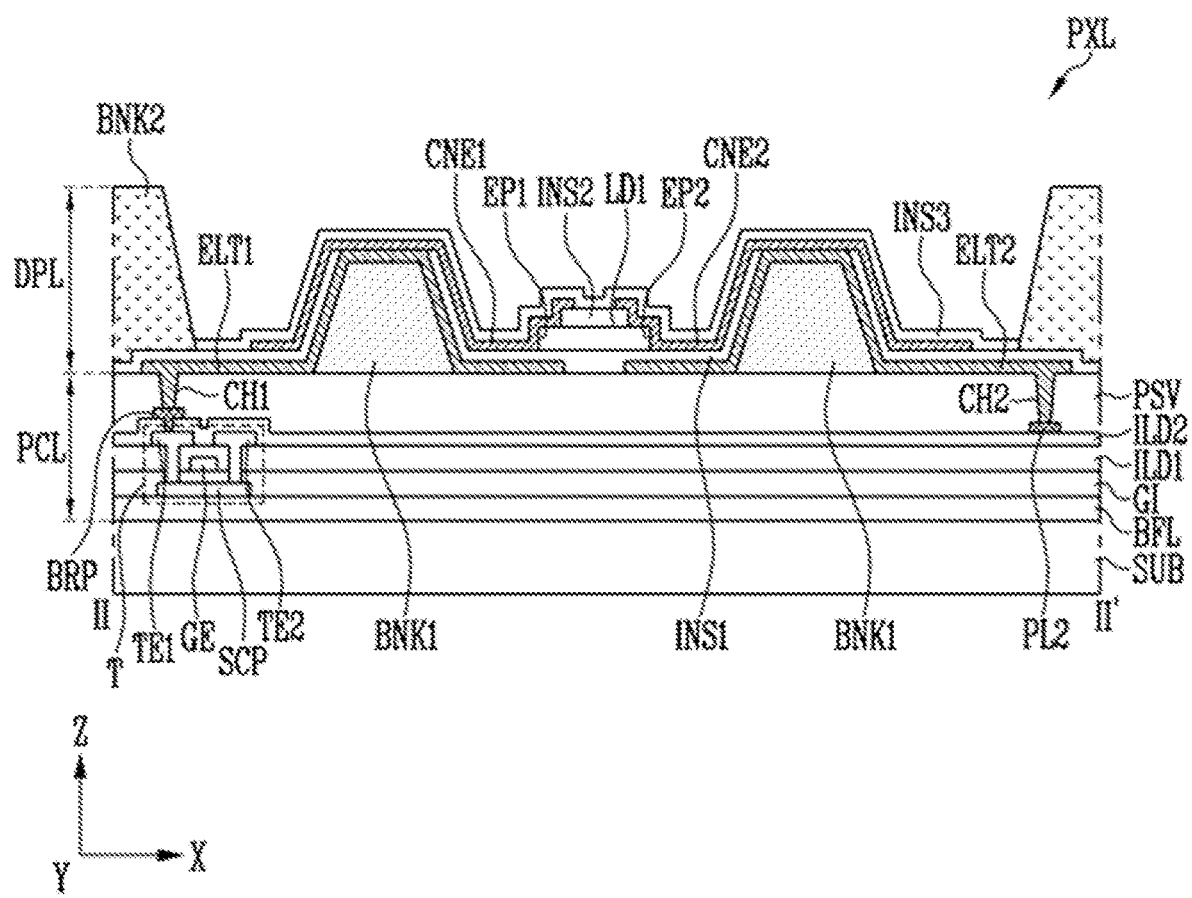
FIGS. 9 and 10 are schematic cross-sectional views taken along a line II-II' of FIG. 7.
Figure 10:
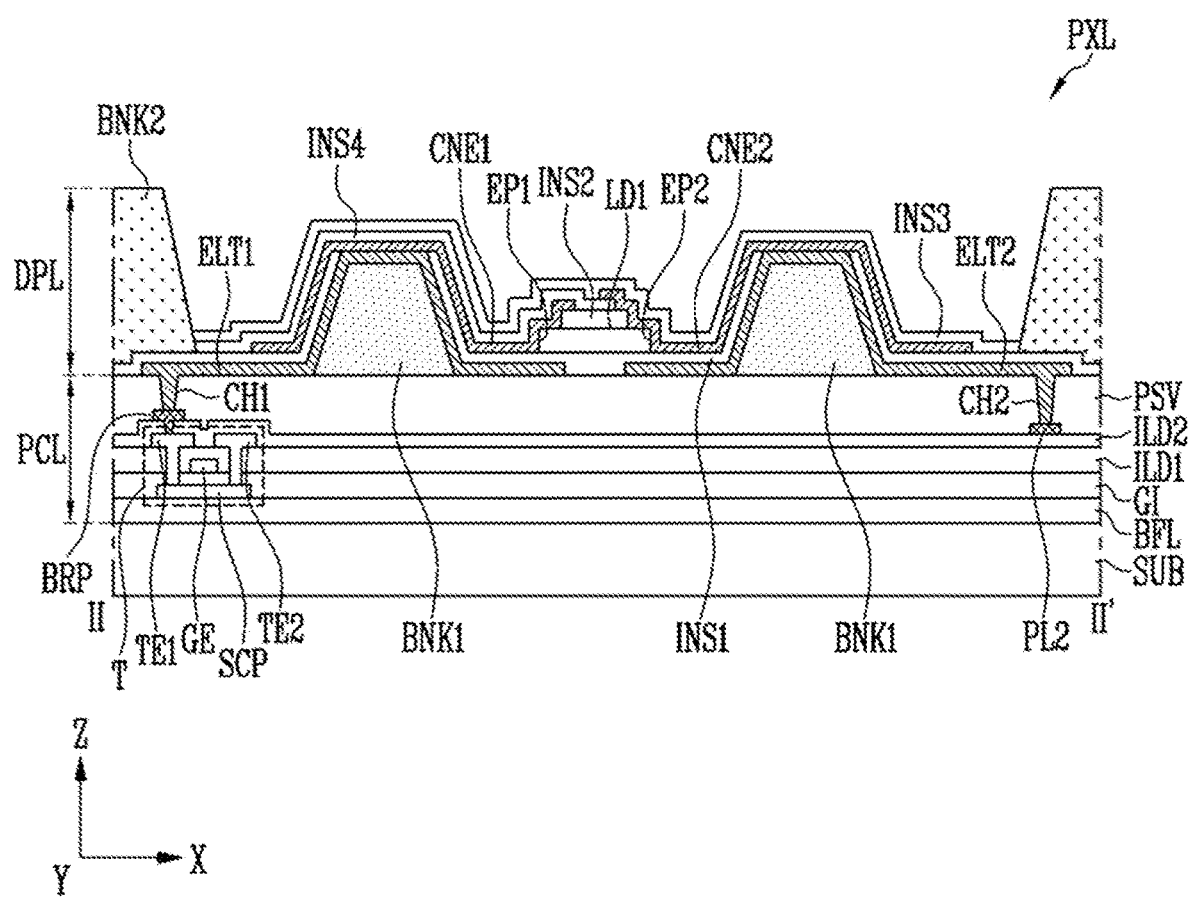

FIG. 7 is a plan view illustrating a pixel according to an embodiment. FIG. 8 is a schematic cross-sectional view taken along a line I-I' of FIG. 7. FIGS. 9 and 10 are schematic cross-sectional views taken along a line II-II' of FIG. 7.

Referring to FIG. 7, each of the pixels PXL may include a plurality of alignment electrodes ELTA and ELTB disposed in an emission area EMA, and light emitting elements LD disposed between the plurality of alignment electrodes ELTA and ELTB.

The emission area EMA of each pixel PXL may be defined or partitioned by a second bank BNK2. The second bank BNK2 may be a structure defining or partitioning the emission area EMA of each pixel PXL, and may be, for example, a pixel defining film. The second bank BNK2 may be disposed at a boundary between adjacent pixels PXL to surround or to be adjacent to the emission area EMA of each pixel PXL.

The second bank BNK2 may include a transparent organic insulating material such as a polyimides resin, a polyamides resin, an acrylic resin (polyacrylates resin), an epoxy resin, a phenolic resin, an unsaturated polyesters resin, a polyphenylenethers resin, polyphenylenesulfides resin, or benzocyclobutene (BCB). However, the second bank BNK2 is not limited thereto, and the second bank BNK2 may include inorganic insulating materials such as silicon oxide, silicon nitride, silicon oxynitride, hafnium oxide, aluminum oxide, titanium oxide, tantalum oxide, and zinc oxide, and may be formed of an organic/inorganic composite layer. According to an embodiment, the second bank BNK2 may be formed to include at least one light blocking and/or reflective material to prevent light leakage between adjacent pixels PXL. For example, the second bank BNK2 may include at least one black matrix material (for example, at least one light blocking material) among various types of black matrix materials, a color filter material of a specific or predetermined color, and/or the like within the spirit and the scope of the disclosure. For example, the second bank BNK2 may be formed in a black opaque pattern to block transmission of light. In an embodiment, a reflective film (not shown) may be formed on a surface (for example, a sidewall) of the second bank BNK2 to further increase light efficiency of the pixel PXL.

For example, in a step of supplying the light emitting elements LD to each pixel PXL, the second bank BNK2 may function as a dam structure that may define the emission area EMA only in a case that the light emitting elements LD are supplied. For example, by partitioning each emission area EMA by the second bank BNK2, ink including a desired type and/or amount of light emitting elements LD may be supplied to the emission area EMA.

The plurality of alignment electrodes ELTA and ELTB may include outer alignment electrodes ELTA disposed relatively outside the emission area and center alignment electrodes ELTB disposed relatively at the center. The center alignment electrodes ELTB may be disposed between the outer alignment electrodes ELTA.

When a predetermined alignment voltage (or alignment signal) is applied to the plurality of alignment electrodes ELTA and ELTB in a process of aligning the light emitting elements LD between the plurality of alignment electrodes ELTA and ELTB, a non-uniform electric field may be formed according to a position in the emission area EMA. For example, a relatively strong electric field may be formed at an outer point compared to a central point in the emission area, and an alignment degree of the light emitting elements LD may be reduced. Accordingly, the display device according to an embodiment may improve the alignment degree of the light emitting elements LD by compensating for an electric field difference in the emission area EMA by differently forming distances of a first direction (X-axis direction) between the plurality of alignment electrodes ELTA and ELTB.

By way of example, a distance DB of the first direction (X-axis direction) between adjacent center alignment electrodes ELTB may be different from distances DA1 and DA2 of the first direction (X-axis direction) between the center alignment electrode ELTB and the outer alignment electrode ELTA. For example, the distance DB of the first direction (X-axis direction) between adjacent center alignment electrodes ELTB may be less than the distances DA1 and DA2 of the first direction (X-axis direction) between the center alignment electrode ELTB and the outer alignment electrode ELTA. In the process of aligning the light emitting elements LD between the outer alignment electrodes ELTA and the center alignment electrodes ELTB, even though a relatively strong electric field is formed at the outer point compared to the center point in the emission area EMA, a uniform electric field may be formed by compensating for the electric field difference in the emission area EMA by forming a narrower distance between the center alignment electrodes ELTB. Therefore, the alignment degree of the light emitting elements LD and the light emission uniformity of each pixel PXL may be improved. According to an embodiment, the distance DB of the first direction (X-axis direction) between adjacent center alignment electrodes ELTB may be less than a length WL of the first direction (X-axis direction) of the light emitting element LD. For example, the distances DA1 and DA2 of the first direction (X-axis direction) between the center alignment electrode ELTB and the outer alignment electrode ELTA may be less than the length WL of the first direction (X-axis direction) of the light emitting element LD, but are not limited thereto.

The outer alignment electrodes ELTA may include a first electrode ELT1 (or a first outer alignment electrode) and a fourth electrode ELT4 (or a second outer alignment electrode) spaced apart from each other with the center alignment electrodes ELTB interposed therebetween. The center alignment electrodes ELTB may include a second electrode ELT2 (or a first center alignment electrode) and a third electrode ELT3 (or a second center alignment electrode).

The second electrode ELT2 may be disposed adjacent to the first electrode ELT1, and the third electrode ELT3 may be disposed adjacent to the fourth electrode ELT4. The first electrode ELT1 may be disposed between the second bank BNK2 and the second electrode ELT2, and the fourth electrode ELT4 may be disposed between the second bank BNK2 and the third electrode ELT3. For example, the first to fourth electrodes ELT1, ELT2, ELT3, and ELT4 may be sequentially disposed to be spaced apart from each other along the first direction (X-axis direction) in the emission area.

Referring to FIGS. 7 and 8, a distance of the first direction (X-axis direction) between the first to fourth electrodes ELT1, ELT2, ELT3, and ELT4 may be different from each other.

By way of example, a distance DA1 of the first direction (X-axis direction) between the first electrode ELT1 and the second electrode ELT2 may be different from a distance DB of the first direction (X-axis direction) between the second electrode ELT2 and the third electrode ELT3. For example, the distance DA1 of the first direction (X-axis direction) between the first electrode ELT1 and the second electrode ELT2 may be greater than the distance DB of the first direction (X-axis direction) between the second electrode ELT2 and the third electrode ELT3.

For example, the distance DB of the first direction (X-axis direction) between the second electrode ELT2 and the third electrode ELT3 may be different from a distance DA2 of the first direction (X-axis direction) between the third electrode ELT3 and the fourth electrode ELT4. For example, the distance DB of the first direction (X-axis direction) between the second electrode ELT2 and the third electrode ELT3 may be less than the distance DA2 of the first direction (X-axis direction) between the third electrode ELT3 and the fourth electrode ELT4.

For example, the distance DA1 of the first direction (X-axis direction) between the first electrode ELT1 and the second electrode ELT2 may be substantially the same as the distance DA2 of the first direction (X-axis direction) between the third electrode ELT3 and the fourth electrode ELT4.

For example, a width of the first to fourth electrodes ELT1, ELT2, ELT3, and ELT4 may be substantially the same. For example, a width WE1 of the first direction (X-axis direction) of the first electrode ELT1, a width WE2 of the first direction (X-axis direction) of the second electrode ELT2, a width WE3 of the first direction (X-axis direction) of the third electrode ELT3, and a width WE4 of the first direction (X-axis direction) of the fourth electrode ELT4 may be substantially the same. However, the disclosure is not limited thereto, and the widths of the first to fourth electrodes ELT1, ELT2, ELT3, and ELT4 may be variously changed according to an embodiment.

A space in which the first to fourth electrodes ELT1, ELT2, ELT3, and ELT4 are spaced apart may be defined as alignment regions R1, R2, and R3. For example, a separation space between the first electrode ELT1 and the second electrode ELT2 may be defined as a first alignment region R1, a separation space between the second electrode ELT2 and the third electrode ELT3 may be defined as a second alignment region R2, and a separation space between the third electrode ELT3 and the fourth electrode ELT4 may be defined as a third alignment region R3. A plurality of light emitting elements LD may be disposed between the first to fourth electrodes ELT1, ELT2, ELT3, and ELT4, for example, in the first to third alignment regions R1, R2, and R3. For example, the light emitting elements LD may include a first light emitting element LD1 disposed in the first alignment region R1, a second light emitting element LD2 disposed in the second alignment region R2, and a third light emitting element LD3 disposed in the third alignment region R3. The first to third light emitting elements LD1, LD2, and LD3 may be electrically connected with each other in series and/or in parallel to form the light source unit LSU of the pixel PXL.

According to an embodiment, the first to third light emitting elements LD1, LD2, and LD3 may be prepared in a form dispersed in a predetermined solution, and may be supplied to the emission area EMA of each pixel PXL through various methods including an inkjet method or a slit coating method. For example, the light emitting elements LD may be mixed with a volatile solvent and supplied to the emission EMA of each pixel PXL. At this time, when a predetermined alignment voltage (or alignment signal) is applied to the first to fourth electrodes ELT1, ELT2, ELT3, and ELT4 of each pixel PXL, an electric field may be formed between the first to fourth electrodes ELT1, ELT2, ELT3, and ELT4, and thus the light emitting elements LD are aligned in the alignment regions R1, R2, and R3 between the first to fourth electrodes ELT1, ELT2, ELT3, and ELT4. After the light emitting elements LD are aligned, the solvent may be volatilized or removed in another method to stably arrange or dispose the light emitting elements LD.

According to an embodiment, each pixel PXL may further include first to fourth contact electrodes CNE1, CNE2, CNE3, and CNE4 for electrically connecting the first to fourth electrodes ELT1, ELT2, ELT3, and ELT4 and the first to third light emitting elements LD1, LD2, and LD3.

The first contact electrode CNE1 may electrically connect one or an end of the first light emitting element LD1 and the first alignment electrode ELT1. The second contact electrode CNE2 may electrically connect another end of the first light emitting element LD1 and the second alignment electrode ELT2. For example, the second contact electrode CNE2 may be electrically connected to one or an end of the second light emitting element LD2. The third contact electrode CNE3 may electrically connect another end of the second light emitting element LD2 and the third alignment electrode ELT3. For example, the third contact electrode CNE3 may be electrically connected to one or an end of the third light emitting element LD3. The fourth contact electrode CNE4 may be electrically connected to another end of the third light emitting element LD3. However, a contact relationship among the first to fourth contact electrodes CNE1, CNE2, CNE3, and CNE4, the first to fourth electrodes ELT, ELT2, ELT3, ELT4, and the first to third light emitting elements LD1, LD2, and LD3 is not limited to the structure illustrated in FIG. 8, and may be variously changed according to an electrical connection relationship of the first to third light emitting elements LD1, LD2, and LD3.

In an embodiment, widths of the first to fourth contact electrodes CNE1, CNE2, CNE3, and CNE4 may be different from each other. For example, a width WC1 of the first direction (X-axis direction) of the first contact electrode CNE1 may be greater than a width WC2 of the first direction (X-axis direction) of the second contact electrode CNE2. For example, a width WC4 of the first direction (X-axis direction) of the fourth contact electrode CNE4 may be greater than a width WC3 of the first direction (X-axis direction) of the third contact electrode CNE3. For example, the width WC1 of the first direction (X-axis direction) of the first contact electrode CNE1 may be substantially the same as the width WC4 of the first direction (X-axis direction) of the fourth contact electrode CNE4. For example, the width WC2 of the first direction (X-axis direction) of the second contact electrode CNE2 may be substantially the same as the width WC3 of the first direction (X-axis direction) of the third contact electrode CNE3. A distance DC of the first direction (X-axis direction) between the first to fourth contact electrodes CNE1, CNE2, CNE3, and CNE4 may be substantially the same, but is not limited thereto. As described above, in a case that the contact electrodes CNE1, CNE2, CNE3, and CNE4 are spaced apart in the substantially same distance and the distance between the alignment electrodes ELTA and ELTB is differently formed, a center line of the contact electrodes CNE1, CNE2, CNE3, and CNE4 and a center line of the alignment electrodes ELTA and ELTB may not coincide. For example, the center line of the second and third contact electrodes CNE2 and CNE3 disposed relatively at the center may not coincide with the center line of the center alignment electrodes ELTB. However, the disclosure is not limited thereto, and the widths and distances of the first to fourth contact electrodes CNE1, CNE2, CNE3, and CNE4 may be variously changed according to an embodiment.

FIGS. 7 and 8 illustrate a case in which four alignment electrodes, for example, the first to fourth electrodes ELT1, ELT2, ELT3, and ELT4, are disposed in the emission area EMA of each pixel PXL, but the disclosure is not limited thereto. For example, the number and positions of the alignment electrodes disposed in each pixel PXL may be variously changed.

Hereinafter, a cross-sectional structure of each pixel PXL is described in detail with reference to FIGS. 9 and 10 based on the first light emitting element LD1. FIGS. 9 and 10 schematically show a structure of each pixel PXL based on one first light emitting element LD1, respectively, and show a transistor T electrically connected to the first electrode ELT1 among various circuit elements forming the pixel circuit PXC. Hereinafter, in a case that it is not necessary to specify the first transistor T1 separately, the first transistor T1 may also be collectively referred to as a "transistor T".

A structure, a position of each layer, and/or the like of the transistors T are/is not limited to the embodiment shown in FIGS. 9 and 10, and may be variously changed according to an embodiment. For example, in an embodiment, the transistors T forming each pixel circuit PXC may have a structure substantially the same as or similar to each other, but are not limited thereto. For example, in an embodiment, at least one of the transistors T forming the pixel circuit PXC may have a cross-sectional structure different from that of the remaining transistors T, and/or may be disposed on a layer different from that of the remaining transistors T.

Referring to FIGS. 9 and 10, the pixel PXL and the display device including the pixel PXL may include the substrate SUB, a circuit layer PCL disposed on one surface of the substrate SUB, and a display layer DPL disposed on the circuit layer.

The circuit layer PCL may include circuit elements forming the pixel circuit PXC of each pixel PXL and various lines electrically connected thereto. The display layer DPL may include electrodes (for example, the first and second electrodes ELT1 and ELT2 and/or the first and second contact electrodes CNE1 and CNE2) and the light emitting elements LD forming the light source unit LSU of each pixel PXL.

The circuit layer PCL may include at least one circuit element electrically connected to the light emitting elements LD of each pixel PXL. For example, the circuit layer PCL may include a plurality of transistors T disposed in each pixel area and forming the pixel circuit PXC of a corresponding pixel PXL. For example, the circuit layer PCL may further include at least one power line and/or signal line electrically connected to each pixel circuit PXC and/or the light source unit LSU. For example, the circuit layer PCL may include the first power line PL1, the second power line PL2, the scan line Si of each pixel PXL, and the data line Dj of each pixel PXL. When the pixel circuit PXC is omitted and the light source unit LSU of each pixel PXL is directly electrically connected to the first and second power lines PL1 and PL2 (or predetermined signal lines), the circuit layer PCL may be omitted.

For example, the circuit layer PCL may include a plurality of insulating layers. For example, the circuit layer PCL may include a buffer layer BFL, a gate insulating layer GI, a first interlayer insulating layer ILD1, a second interlayer insulating layer ILD2, and/or a passivation layer PSV sequentially stacked each other on one surface of the substrate SUB. For example, the circuit layer PCL may selectively further include at least one light blocking pattern (not shown) disposed under or below at least some or a number of the transistors T.

The buffer layer BFL may prevent diffusion of an impurity into each circuit element. The buffer layer BFL may be formed as a single layer, but may be formed as multiple layers of at least two or more layers. In a case that the buffer layer BFL is provided as multiple layers, each layer may be formed of the same or similar material or may be formed of different materials. Various circuit elements such as the transistors T and various lines electrically connected to the circuit elements may be disposed on the buffer layer BFL. The buffer layer BFL may be omitted according to an embodiment. At least one circuit element and/or line may be directly disposed on one surface of the substrate SUB.

Each transistor T may include a semiconductor pattern SCP (also referred to as a "semiconductor layer" or an "active layer"), a gate electrode GE, and first and second transistor electrodes TE1 and TE2. In FIGS. 9 and 10, an embodiment in which each transistor T may include the first and second transistor electrodes TE1 and TE2 formed separately from the semiconductor pattern SCP is shown, but the embodiment is not limited thereto. For example, in an embodiment, the first transistor electrode TE1 and/or the second transistor electrode TE2 provided or disposed in at least one transistor T may be integrated with each semiconductor pattern SCP.

The semiconductor pattern SCP may be disposed on the buffer layer BFL. For example, the semiconductor pattern SCP may be disposed between the substrate SUB on which the buffer layer BFL is formed and the gate insulating layer GI. The semiconductor pattern SCP may include a first region that may be in electrical contact with each first transistor electrode TE1, a second region that may be in electrical contact with each second transistor electrode TE2, and a channel region positioned or disposed between the first and second regions. According to an embodiment, one of the first and second regions may be a source region and the other may be a drain region.

According to an embodiment, the semiconductor pattern SCP may be a semiconductor pattern formed of polysilicon, amorphous silicon, oxide semiconductor, or the like within the spirit and the scope of the disclosure. For example, the channel region of the semiconductor pattern SCP may be an intrinsic semiconductor as a semiconductor pattern that may not be doped with an impurity, and each of the first and second regions of the semiconductor pattern SCP may be a semiconductor pattern doped with a predetermined impurity.

In an embodiment, the semiconductor patterns SCP of the transistors T forming each pixel circuit PXC may be formed of substantially the same or similar material. For example, the semiconductor pattern SCP of the transistors T may be formed of the same or similar material among polysilicon, amorphous silicon, and oxide semiconductor.

In an embodiment, some or a number of the transistors T and others of the transistors T may include semiconductor patterns SCP formed of different materials. For example, the semiconductor pattern SCP of some or a number of the transistors T may be formed of polysilicon or amorphous silicon, and the semiconductor pattern SCP of the others of the transistors T may be formed of oxide semiconductor.

The gate insulating layer GI may be disposed on the semiconductor pattern SCP. For example, the gate insulating layer GI may be disposed between the semiconductor pattern SCP and the gate electrode GE. The gate insulating layer GI may be formed as a single layer or multiple layers, and may include various types of organic/inorganic insulating materials including silicon nitride ($SiN_x$), silicon oxide ($SiO_x$), or silicon oxynitride ($SiO_xN_y$).

The gate electrode GE may be disposed on the gate insulating layer GI. For example, the gate electrode GE may be disposed to overlap the semiconductor pattern SCP with the gate insulating layer GI interposed therebetween. In FIGS. 9 and 10, the transistor T of a top-gate structure is shown, but in an embodiment, the transistor T may have a bottom-gate structure. The gate electrode GE may be disposed to overlap the semiconductor pattern SCP under or below the semiconductor pattern SCP.

The first interlayer insulating layer ILD1 may be disposed on the gate electrode GE. For example, the first interlayer insulating layer ILD1 may be disposed between the gate electrode GE and the first and second transistor electrodes TE1 and TE2. The first interlayer insulating layer ILD1 may be formed as a single layer or multiple layers, and may include at least one inorganic insulating material and/or an organic insulating material. For example, the first interlayer insulating layer ILD1 may include various types of organic/inorganic insulating materials including silicon nitride ($SiN_x$), silicon oxide ($SiO_x$), silicon oxynitride ($SiO_xN_y$), or the like, and a configuration of material or materials of the first interlayer insulating layer ILD1 is not particularly limited.

The first and second transistor electrodes TE1 and TE2 may be disposed on each semiconductor pattern SCP with at least one first interlayer insulating layer ILD1 interposed therebetween. For example, the first and second transistor electrodes TE1 and TE2 may be disposed on different end portions of the semiconductor pattern SCP with the gate insulating layer GI and the first interlayer insulating layer ILD1 interposed therebetween. The first and second transistor electrodes TE1 and TE2 may be electrically connected to each semiconductor pattern SCP. For example, the first and second transistor electrodes TE1 and TE2 may be electrically connected to the first and second regions of the semiconductor pattern SCP through respective contact holes passing through the gate insulating layer GI and the first interlayer insulating layer ILD1. According to an embodiment, one of the first and second transistor electrodes TE1 and TE2 may be a source electrode, and the other may be a drain electrode.

At least one transistor T provided or disposed in the pixel circuit PXC may be electrically connected to at least one pixel electrode. For example, the transistor T may be electrically connected to the first electrode ELT1 of a corresponding pixel PXL through a contact hole (for example, a first contact hole CH1) passing through the passivation layer PSV, and/or a bridge pattern BRP.

In an embodiment, at least one signal line and/or power line electrically connected to each pixel PXL may be disposed on the same layer as one electrode of the circuit elements forming the pixel circuit PXC. For example, the scan line Si of each pixel PXL may be disposed on the same layer as the gate electrodes GE of the transistors T, and the data line Dj of each pixel PXL may be disposed on the same layer as the first and second transistor electrodes TE1 and TE2 of the transistors T.

The first power line PL1 and/or the second power line PL2 may be disposed on the same layer as the gate electrodes GE or the first and second transistor electrodes TE1 and TE2 of the transistors T, or may be disposed on a layer different from that of the gate electrodes GE or the first and second transistor electrodes TE1 and TE2 of the transistors T. For example, the second power line PL2 for supplying the second power VSS may be disposed on the second interlayer insulating layer ILD2 and at least partially covered or overlapped by the passivation layer PSV. The second power line PL2 may be electrically connected to the second electrode ELT2 of the light source unit LSU disposed on the passivation layer PSV through a second contact hole CH2 passing through the passivation layer PSV. However, positions and/or structures of the first power line PL1 and/or the second power line PL2 may be variously changed. For example, the second power line PL2 may be disposed on the same layer as the gate electrodes GE or the first and second transistor electrodes TE1 and TE2 of the transistors T, and may be electrically connected to the second electrode ELT2 through the second contact hole CH2 and/or at least one bridge pattern which is not shown.

The second interlayer insulating layer ILD2 may be disposed on the first interlayer insulating layer ILD1 and may cover or overlap the first and second transistor electrodes TE1 and TE2 positioned on the first interlayer insulating layer ILD1. The second interlayer insulating layer ILD2 may be formed as a single layer or multiple layers, and may include at least one inorganic insulating material and/or organic insulating material. For example, the second interlayer insulating layer ILD2 may include various types of organic/inorganic insulating materials including silicon nitride ($SiN_x$), silicon oxide ($SiO_x$), or silicon oxynitride ($SiO_xN_y$), but is not limited thereto.

The bridge pattern BRP for electrically connecting at least one circuit element (for example, the first transistor T1) provided or disposed in the pixel circuit PXC to the first electrode ELT1, the first power line PL1, and/or the second power line PL2 may be disposed on the second interlayer insulating layer ILD2. However, the second interlayer insulating layer ILD2 may be omitted according to an embodiment. The bridge pattern BRP or the like of FIGS. 9 and 10 may be omitted, and the second power line PL2 may be disposed on a layer on which one electrode of the transistor T is disposed.

The passivation layer PSV may be disposed on the circuit elements including the transistors T and/or the lines including the first and second power lines PL1 and PL2. The passivation layer PSV may be formed as a single layer or multiple layers, and may include at least one inorganic insulating material and/or organic insulating material. For example, the passivation layer PSV may include at least an organic insulating layer and may serve to substantially planarize a surface of the circuit layer PCL.

The display layer DPL may be disposed on the passivation layer PSV of the circuit layer PCL. The display layer DPL may include at least one pair of first electrode ELT1 and second electrode ELT2 disposed in the emission area EMA of each pixel PXL and forming each light source unit LSU, and at least one light emitting element LD electrically connected between the first electrode ELT1 and the second electrode ELT2. In FIGS. 9 and 10, one light emitting element LD disposed in each pixel PXL is shown, but as shown in FIG. 7, each pixel PXL may include a plurality of light emitting elements LD electrically connected between the first and second electrodes ELT1 and ELT2. Therefore, hereinafter, each embodiment is described under an assumption that the pixel PXL may include the plurality of light emitting elements LD.

For example, the display layer DPL may further include the first and second contact electrodes CNE1 and CNE2 for more stably electrically connecting the light emitting elements LD between the first and second electrodes ELT1 and ELT2, and a first bank BNK1 for protruding one or a region of each of the first and second electrodes ELT1 and ELT2 and/or the first and second contact electrodes CNE1 and CNE2 upward. For example, the display layer DPL may further include at least one conductive layer, insulating layer, and/or the like within the spirit and the scope of the disclosure.

The first bank BNK1 may be disposed on the circuit layer PCL. The first bank BNK1 may be formed in a separate type or integrated type pattern. The first bank BNK1 may protrude in a height direction (for example, a third direction (Z-axis direction)) of the substrate SUB.

The first bank BNK1 may have various shapes according to an embodiment. In an embodiment, the first bank BNK1 may be a bank structure having a positive taper structure. For example, the first bank BNK1 may be formed to have an inclined surface inclined at a constant angle with respect to the substrate SUB. However, the disclosure is not limited thereto, and the first bank BNK1 may have a sidewall of a substantially curved surface, a substantially step shape, or the like within the spirit and the scope of the disclosure. For example, the first bank BNK1 may have a cross section substantially of a semicircle shape, a substantially semi-ellipse shape, or the like within the spirit and the scope of the disclosure.

Electrodes and insulating layers disposed on the first bank BNK1 may have a shape substantially corresponding to the first bank BNK1. For example, the first and second electrodes ELT1 and ELT2 and the first and second contact electrodes CNE1 and CNE2 may be disposed on one or a region of the first bank BNK1 and may include an inclined surface or a curved surface having a shape substantially corresponding to the shape of the first bank BNK1. Similarly, a first insulating layer INS1, a third insulating layer INS3, and/or a fourth insulating layer INS4 may be disposed on the first bank BNK1 and may include a substantially inclined surface or a substantially curved surface having a shape substantially corresponding to the shape of the first bank BNK1.

The first bank BNK1 may include an organic insulating material such as a polyimides resin, a polyamides resin, an acrylic resin (polyacrylates resin), an epoxy resin, a phenolic resin, an unsaturated polyesters resin, a polyphenylenethers resin, polyphenylenesulfides resin, or benzocyclobutene (BCB). However, the first bank BNK1 is not limited thereto, and the first bank BNK1 may include inorganic insulating materials such as silicon oxide, silicon nitride, silicon oxynitride, hafnium oxide, aluminum oxide, titanium oxide, tantalum oxide, and zinc oxide, and may be formed of an organic/inorganic composite layer. According to an embodiment, the first bank BNK1 may include the same or similar material as the second bank BNK2 described above.

In an embodiment, the first bank BNK1 may function as a reflective member. For example, the first bank BNK1 may function as a reflective member that guides light emitted from each light emitting element LD in a desired direction (an upper direction of the pixel PXL) and improves light efficiency of the pixel PXL together with the first and second electrodes ELT1 and ELT2 provided or disposed thereon.

The first and second electrodes ELT1 and ELT2 forming pixel electrodes of each pixel PXL may be disposed on the first bank BNK1. The first electrode ELT1 and the second electrode ELT2 may be disposed in each pixel area where each pixel PXL is provided or disposed and/or formed. For example, the first electrode ELT1 and the second electrode ELT2 may be disposed in the emission area EMA of each pixel PXL. The first and second electrodes ELT1 and ELT2 may be disposed to be spaced apart from each other. For example, the first and second electrodes ELT1 and ELT2 may be spaced apart from each other by a predetermined distance in each emission area EMA, and may be disposed side by side.

According to an embodiment, the first electrode ELT1 and/or the second electrode ELT2 may have a pattern that may be separated for each pixel PXL or may have a pattern commonly electrically connected to the plurality of pixels PXL. Before a process of forming the pixel PXL, for example, before an alignment of the light emitting elements LD is completed, the first electrodes ELT1 of the pixels PXL disposed in the display area DA may be electrically connected to each other, and the second electrodes ELT2 of the pixels PXL may be electrically connected to each other. For example, before the alignment of the light emitting elements LD is completed, the first electrodes ELT1 of the pixels PXL may be formed integrally or non-integrally with each other and may be electrically connected to each other, and the second electrodes ELT2 of the pixels PXL may be formed integrally or non-integrally with each other and may be electrically connected to each other. In a case that the first electrodes ELT1 or the second electrodes ELT2 of the pixels PXL may be connected non-integrally with each other, the first electrodes ELT1 or the second electrodes ELT2 may be electrically connected to each other by at least one contact hole, bridge pattern, and/or the like within the spirit and the scope of the disclosure.

The first and second electrodes ELT1 and ELT2 may receive a first alignment signal (or a first alignment voltage) and a second alignment signal (or a second alignment voltage), respectively, in an alignment step of the light emitting elements LD. For example, one of the first and second electrodes ELT1 and ELT2 may receive an alignment signal of an alternating current form, and the other of the first and second electrodes ELT1 and ELT2 may receive an alignment voltage (for example, a ground voltage) having a constant voltage level. For example, a predetermined alignment signal may be applied to the first and second electrodes ELT1 and ELT2 in the alignment step of the light emitting elements LD. Accordingly, an electric field may be formed between the first and second electrodes ELT1 and ELT2. The light emitting elements LD supplied to the emission area EMA of each pixel PXL may self-align between the first and second electrodes ELT1 and ELT2 by the electric field. After the alignment of the light emitting elements LD is completed, the pixels PXL may be formed or disposed in a form in which individual driving is possible by disconnecting between at least the first electrodes ELT1 between the pixels PXL.

The first electrode ELT1 may be electrically connected to a predetermined circuit element (for example, at least one transistor forming the pixel circuit PXC), a power line (for example, the first power line PL1) and/or a signal line (for example, the scan line Si, the data line Dj, or a predetermined control line) through the first contact hole CH1. In an embodiment, the first electrode ELT1 may be electrically connected to the bridge pattern BRP through the first contact hole CH1, and may be electrically connected to the transistor T through the bridge pattern BRP. However, the disclosure is not limited thereto, and the first electrode ELT1 may be directly electrically connected to a predetermined power line or signal line.

The second electrode ELT2 may be electrically connected to a predetermined circuit element (for example, at least one transistor forming the pixel circuit PXC), a power line (for example, the second power line PL2) and/or a signal line (for example, the scan line Si, the data line Dj, or a predetermined control line) through the second contact hole CH2. In an embodiment, the second electrode ELT2 may be electrically connected to the second power line PL2 through the second contact hole CH2. However, the disclosure is not limited thereto, and the second electrode ELT2 may be directly electrically connected to a predetermined power line or signal line.

Each of the first and second electrodes ELT1 and ELT2 may include at least one conductive material. For example, each of the first and second electrodes ELT1 and ELT2 may include at least one conductive material such as at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy including the same, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO) or a fluorine tin oxide (FTO), and a conductive polymer such as polyethylenedioxythiophene (PEDOT), but is not limited thereto. For example, each of the first and second electrodes ELT1 and ELT2 may include other conductive materials including a carbon nanotube, grapheme, or the like within the spirit and the scope of the disclosure. For example, each of the first and second electrodes ELT1 and ELT2 may be formed as a single layer or multiple layers. For example, each of the first and second electrodes ELT1 and ELT2 may include a reflective electrode layer including a reflective conductive material. For example, each of the first and second electrodes ELT1 and ELT2 may selectively further include at least one of at least one layer of transparent electrode layer disposed on and/or under or below the reflective electrode layer, and at least one layer of conductive capping layer covering or overlapping an upper portion of the reflective electrode layer and/or the transparent electrode layer.

The first insulating layer INS1 may be disposed on one or a region of the first and second electrodes ELT1 and ELT2. For example, the first insulating layer INS1 may be formed to cover or overlap one or a region of each of the first and second electrodes ELT1 and ELT2, and may include an opening exposing another region of each of the first and second electrodes ELT1 and ELT2. For example, the first insulating layer INS1 may include an opening formed on an upper surface of the first bank BNK1. The first and second electrodes ELT1 and ELT2 may be electrically connected to the first and second contact electrodes CNE1 and CNE2, respectively, in a region in which the first insulating layer INS1 is opened. The first insulating layer INS1 may be omitted according to an embodiment. The light emitting elements LD may be directly disposed on the passivation layer PSV and/or one or an end of each of the first and second electrodes ELT1 and ELT2.

In an embodiment, the first insulating layer INS1 may be formed to firstly cover or overlap the first and second electrodes ELT1 and ELT2 entirely. After the light emitting elements LD are supplied and aligned on the first insulating layer INS1, the first insulating layer INS1 may be partially opened to expose one or a region of the first and second electrodes ELT1 and ELT2. For example, the first insulating layer INS1 may have an opening exposing one or a region of the first and second electrodes ELT1 and ELT2 on the upper surface of the first bank BNK1, and may partially cover or overlap the inclined surfaces or the curved surfaces of the first and second electrodes ELT1 and ELT2. As another example, in an embodiment, after the supply and the alignment of the light emitting elements LD are completed, the first insulating layer INS1 may be patterned in a form of an individual pattern locally disposed only under or below the light emitting elements LD. The first insulating layer INS1 may be formed or disposed to cover or overlap the first and second electrodes ELT1 and ELT2 after the first and second electrodes ELT1 and ELT2 are formed. Accordingly, the first and second electrodes ELT1 and ELT2 may be prevented from being damaged in a subsequent process.

The first insulating layer INS1 may be formed as a single layer or multiple layers, and may include at least one inorganic insulating material and/or organic insulating material. For example, the first insulating layer INS1 may include various types of organic/inorganic insulating materials such as silicon nitride ($SiN_x$), silicon oxide ($SiO_x$), silicon oxynitride ($SiO_xN_y$), or aluminum oxide ($AlO_x$).

The light emitting elements LD may be supplied and aligned on the first and second electrodes ELT1 and ELT2 and the first insulating layer INS1. The light emitting elements LD may be supplied to respective pixel areas in which the first bank BNK1, the first and second electrodes ELT1 and ELT2, the first insulating layer INS1, and the like are formed, and may be aligned between the first and second electrodes ELT1 and ELT2. For example, the plurality of light emitting elements LD may be supplied to the emission area EMA of each pixel PXL through an inkjet method, a slit coating method, or various other methods, and the light emitting elements LD may be aligned with directivity between the first and second electrodes ELT1 and ELT2 by a predetermined alignment signal (or alignment voltage) applied to each of the first and second electrodes ELT1 and ELT2.

In an embodiment, at least some or a number of the light emitting elements LD may be disposed between a pair of first and second electrodes ELT1 and ELT2 so that the both end portions (for example, the first and second end portions EP1 and EP2) overlap a pair of adjacent first and second electrodes ELT1 and ELT2. In an embodiment, at least some or a number of the light emitting elements LD may be disposed between a pair of adjacent first and second electrodes ELT1 and ELT2 so as not to overlap the first electrode ELT1 and/or the second electrode ELT2, and may be electrically connected to the pair of first and second electrodes ELT1 and ELT2 through the first and second contact electrodes CNE1 and CNE2, respectively. Each light emitting element LD electrically connected between the first and second electrodes ELT1 and ELT2 may form an effective light source of a corresponding pixel PXL. The effective light sources may form the light source unit LSU of the pixel PXL.

A second insulating layer INS2 may be disposed on one or a region of the light emitting elements LD. For example, the second insulating layer INS2 may be disposed on one or a region of each of the light emitting elements LD to expose the first and second end portions EP1 and EP2 of each of the light emitting elements LD. For example, the second insulating layer INS2 may be locally disposed on one or a region including a central region of each of the light emitting elements LD. In a case that the second insulating layer INS2 is formed on the light emitting elements LD after the alignment of the light emitting elements LD is completed, the light emitting elements LD may be prevented from being deviated from a position where the light emitting elements LD are aligned.

The second insulating layer INS2 may be formed in an independent pattern in the emission area EMA of each pixel PXL, but is not limited thereto. According to an embodiment, the second insulating layer INS2 may be omitted, and one or an end of each of the first and second contact electrodes CNE1 and CNE2 may be directly positioned on an upper surface of the light emitting elements LD.

The second insulating layer INS2 may be formed as a single layer or multiple layers, and may include at least one inorganic insulating material and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), aluminum oxide ($AlO_x$), and a photoresist (PR) material.

The both end portions of the light emitting elements LD that may not be covered or overlapped by the second insulating layer INS2, for example, the first and second end portions EP1 and EP2 may be covered or overlapped by the first and second contact electrodes CNE1 and CNE2, respectively. The first and second contact electrodes CNE1 and CNE2 may be formed or disposed to be spaced apart from each other. For example, the adjacent first and second contact electrodes CNE1 and CNE2 may be disposed with the second insulating layer INS2 interposed therebetween, and may be disposed to be spaced apart from each other on the first and second end portions EP1 and EP2 of at least one adjacent light emitting element LD.

For example, the first and second contact electrodes CNE1 and CNE2 may be disposed on the first and second electrodes ELT1 and ELT2 to cover or overlap exposed regions of each of the first and second electrodes ELT1 and ELT2. For example, the first and second contact electrodes CNE1 and CNE2 may be disposed on at least one or a region of each of the first and second electrodes ELT1 and ELT2 to be in direct/indirect contact with each of the first and second electrodes ELT1 and ELT2 on the first bank BNK1 or around the first bank BNK1. Accordingly, the first and second contact electrodes CNE1 and CNE2 may be electrically connected to the first and second electrodes ELT1 and ELT2, respectively. For example, each of the first and second electrodes ELT1 and ELT2 may be electrically connected to the first end portion EP1 or the second end portion EP2 of the at least one adjacent light emitting element LD through the first and second contact electrodes CNE1 and CNE2.

The first and second contact electrodes CNE1 and CNE2 may be formed of various transparent conductive materials. For example, the first and second contact electrodes CNE1 and CNE2 may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO) or a fluorine tin oxide (FTO), and may be implemented substantially transparent or translucent to satisfy a predetermined transmittance. Accordingly, the light emitted from the light emitting elements LD through each of the first and second end portions EP1 and EP2 may transmit the first and second contact electrodes CNE1 and CNE2 and may be emitted to the outside of the display panel PNL.

In an embodiment, the first and second contact electrodes CNE1 and CNE2 may be disposed on the same layer as shown in FIG. 9. For example, the first and second contact electrodes CNE1 and CNE2 may be formed of the same conductive layer on one or a surface of the substrate SUB. Since the first and second contact electrodes CNE1 and CNE2 may be simultaneously formed in the same process, a manufacturing process of the pixel PXL and the display device including the pixel PXL may be simplified. However, the disclosure is not limited thereto, and the first and second contact electrodes CNE1 and CNE2 may be sequentially formed. For example, the first and second contact electrodes CNE1 and CNE2 may be sequentially formed on different layers on one surface of the substrate SUB as shown in FIG. 10. The fourth insulating layer INS4 may be disposed between the first contact electrode CNE1 and the second contact electrode CNE2. In a case that the fourth insulating layer INS4 is disposed between the first contact electrode CNE1 and the second contact electrode CNE2, electrical stability between the first and second end portions EP1 and EP2 of the light emitting elements LD may be secured. For example, the first and second contact electrodes CNE1 and CNE2 may be stably separated by the fourth insulating layer INS4. Accordingly, a short defect may be effectively prevented from occurring between the first and second end portions EP1 and EP2 of the light emitting elements LD. The fourth insulating layer INS4 may be formed as a single layer or multiple layers, and may include at least one inorganic insulating material and/or organic insulating material. For example, the fourth insulating layer INS4 may include various types of organic/inorganic insulating materials including silicon nitride ($SiN_x$), silicon oxide ($SiO_x$), silicon oxynitride ($SiO_xN_y$), or aluminum oxide ($AlO_x$).

The third insulating layer INS3 may be disposed on the first and second contact electrodes CNE1 and CNE2. For example, the third insulating layer INS3 may cover or overlap the first bank BNK1, the first and second electrodes ELT1 and ELT2, the light emitting elements LD, and the first and second contact electrodes CNE1 and CNE2. The third insulating layer INS3 may be formed as a single layer or multiple layers, and may include at least one inorganic insulating material and/or organic insulating material. For example, the third insulating layer INS3 may include various types of organic/inorganic insulating materials including silicon nitride ($SiN_x$), silicon oxide ($SiO_x$), silicon oxynitride ($SiO_xN_y$), or aluminum oxide ($AlO_x$).

In an embodiment, the third insulating layer INS3 may include a thin film encapsulation layer of a multilayer structure. For example, the third insulating layer INS3 may be formed of a thin film encapsulation layer of a multilayer structure including at least two inorganic insulating layers and at least one organic insulating layer interposed between the at least two inorganic insulating layers. However, the disclosure is not limited thereto, and the material and/or structure of the third insulating layer INS3 may be variously changed.

In accordance with the display device according to the above-described embodiment, in the process of aligning the light emitting elements LD between the outer alignment electrodes ELTA and the center alignment electrodes ELTB, even though a relatively strong electric field is formed at the outer point compared to the center point in the emission area EMA, a uniform electric field may be formed by compensating for an electric field difference in the emission area EMA by forming a narrower distance between the center alignment electrodes ELTB. For example, the alignment degree of the light emitting elements LD and the uniformity of the light emission of each pixel PXL may be improved.

Hereinafter, an embodiment is described. In the following embodiment, the same configurations as those previously described are denoted by the same reference numerals, and a repetitive description is omitted or simplified.

Figure 11:
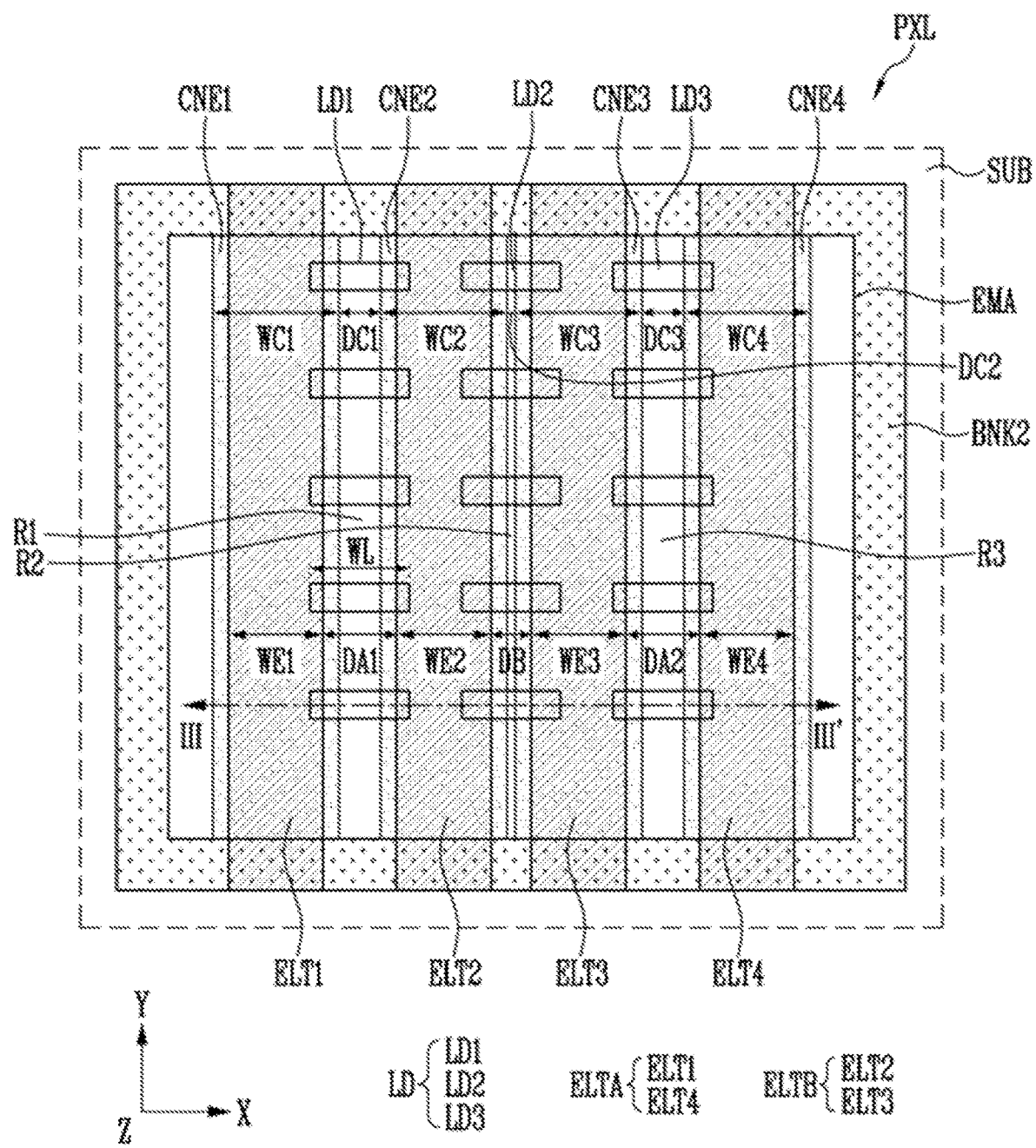
FIG. 11 is a plan view illustrating a pixel according to an embodiment.
Figure 12:
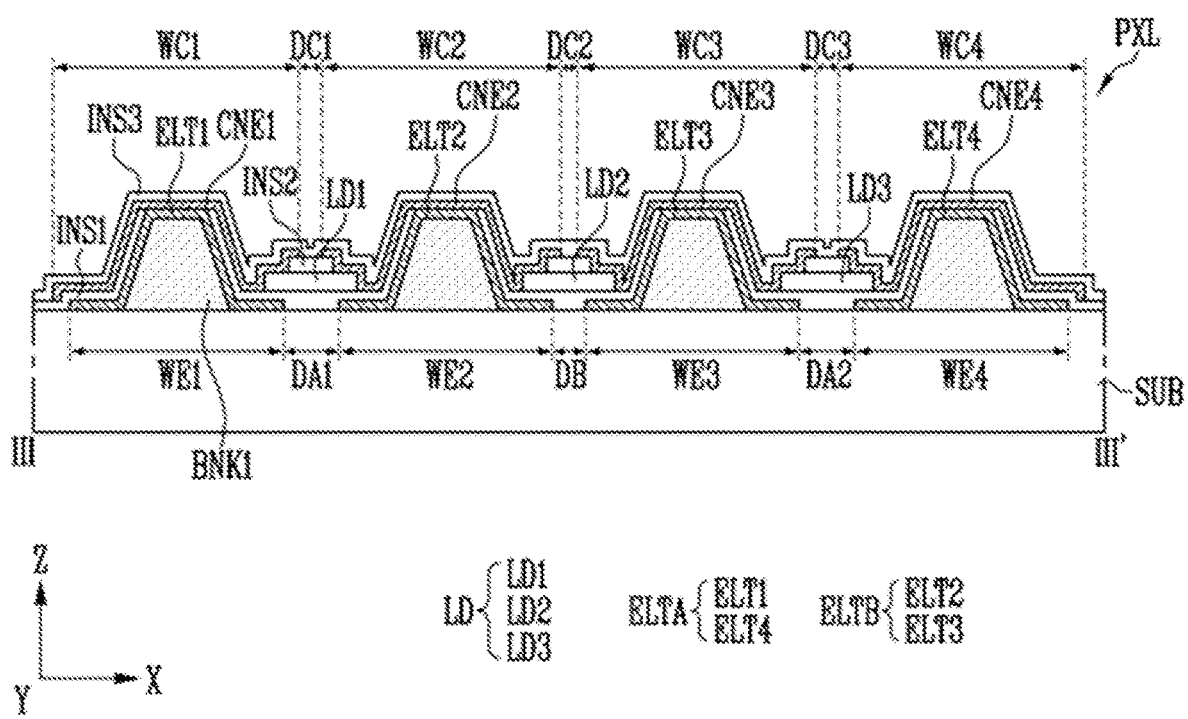
FIG. 12 is a schematic cross-sectional view taken along a line III-III' of FIG. 11.

FIG. 11 is a plan view illustrating a pixel according to an embodiment. FIG. 12 is a schematic cross-sectional view taken along a line III-III' of FIG. 11.

Referring to FIGS. 11 and 12, the display device according to an embodiment may be different from that of an embodiment of FIGS. 1 to 10 in that the widths of the first to fourth contact electrodes CNE1, CNE2, CNE3, and CNE4 are substantially the same.

By way of example, the width WC1 of the first direction (X-axis direction) of the first contact electrode CNE1, the width WC2 of the first direction (X-axis direction) of the second contact electrode CNE2, the width WC3 of the first direction (X-axis direction) of the third contact electrode CNE3, and the width WC4 of the first direction (X-axis direction) of the fourth contact electrode CNE4 may be substantially the same.

For example, distances between the first to fourth contact electrodes CNE1, CNE2, CNE3, and CNE4 may be different from each other. For example, a distance DC1 of the first direction (X-axis direction) between the first contact electrode CNE1 and the second contact electrode CNE2 may be greater than a distance DC2 of the first direction (X-axis direction) between the second contact electrode CNE2 and the third contact electrode CNE3. For example, the distance DC2 of the first direction (X-axis direction) between the second contact electrode CNE2 and the third contact electrode CNE3 may be less than a distance DC3 of the first direction (X-axis direction) between the third contact electrode CNE3 and the fourth contact electrode CNE4. For example, the distance DC1 of the first direction (X-axis direction) between the first contact electrode CNE1 and the second contact electrode CNE2 may be substantially the same as the distance DC3 of the first direction (X-axis direction) between the third contact electrode CNE3 and the fourth contact electrode CNE4.

In a case of an embodiment, the widths and the distances of the contact electrodes CNE1, CNE2, CNE3, and CNE4 may be formed so that a center line of the first to fourth contact electrodes CNE1, CNE2, CNE3, and CNE4 coincides with a center line of the first to fourth alignment electrodes ELT1, ELT2, ELT3, and ELT4, respectively. However, the disclosure is not limited thereto, and the widths and the distances of the first to fourth contact electrodes CNE1, CNE2, CNE3, and CNE4 may be variously changed according to an embodiment.

Figure 13:
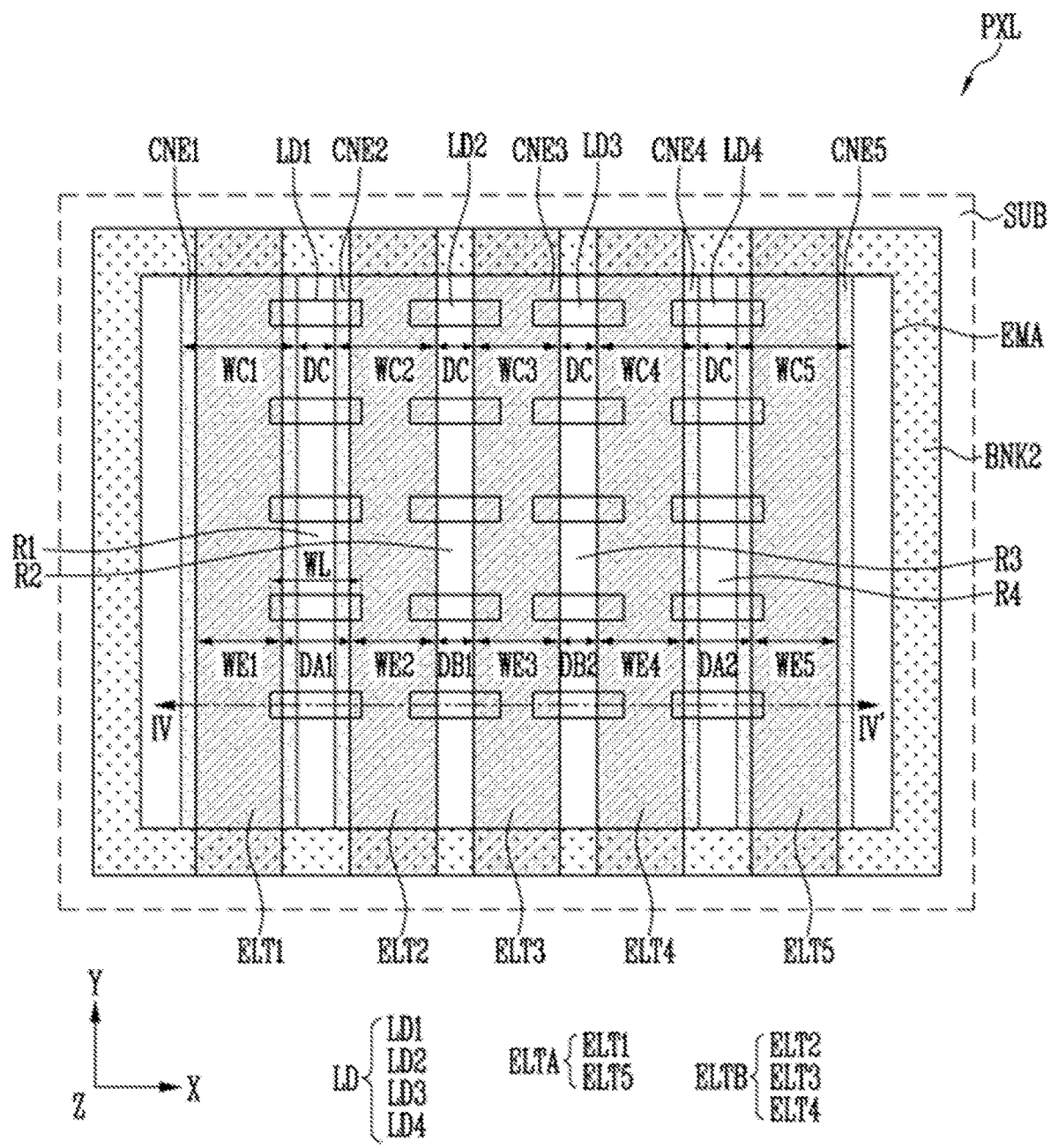
FIG. 13 is a plan view illustrating a pixel according to an embodiment.
Figure 14:
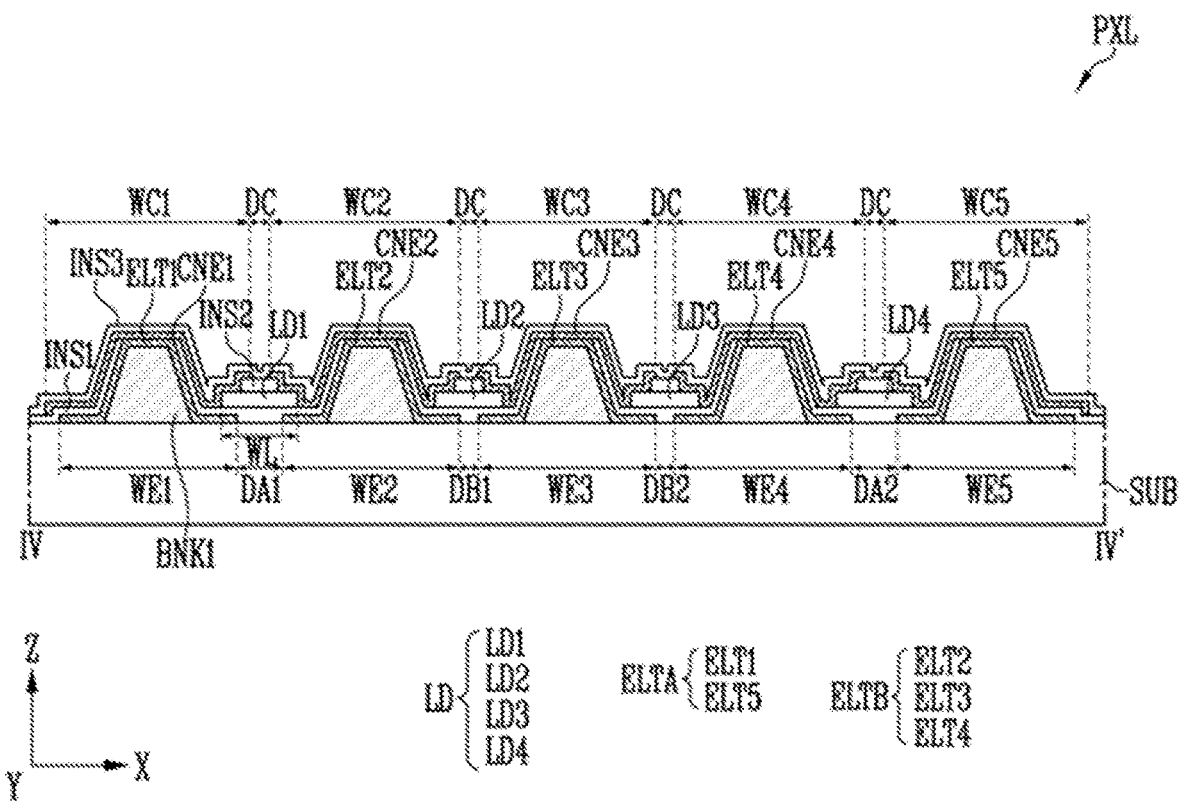
FIG. 14 is a schematic cross-sectional view taken along a line IV-IV' of FIG. 13.

FIG. 13 is a plan view illustrating a pixel according to an embodiment. FIG. 14 is a schematic cross-sectional view taken along a line IV-IV' of FIG. 13.

Referring to FIGS. 13 and 14, an embodiment may be different from an embodiment of FIGS. 1 to 12 in that the outer alignment electrode ELTA is formed of two electrodes ELT1 and ELT5 and the center alignment electrode ELTB is formed of three electrodes ELT2, ELT3, and ELT4.

The outer alignment electrodes ELTA may include a first electrode ELT1 (or a first outer alignment electrode) and a fifth electrode ELT5 (or a second outer alignment electrode) spaced apart with the center alignment electrodes ELTB interposed therebetween. The center alignment electrodes ELTB may include a second electrode ELT2 (or a first center alignment electrode), a third electrode ELT3 (or a second center alignment electrode), and a fourth electrode ELT4 (or a third center alignment electrode).

The second electrode ELT2 may be disposed adjacent to the first electrode ELT1, and the fourth electrode ELT4 may be disposed adjacent to the fifth electrode ELT5. The third electrode ELT3 may be disposed between the second electrode ELT2 and the fourth electrode ELT4. For example, the first to fifth electrodes ELT1, ELT2, ELT3, ELT4, and ELT5 may be sequentially disposed to be spaced apart from each other along the first direction (X-axis direction) in the emission area EMA.

Referring to FIGS. 13 and 14, distances of the first direction (X-axis direction) between the first to fifth electrodes ELT1, ELT2, ELT3, ELT4, and ELT5 may be different from each other.

By way of example, a distance DA1 of the first direction (X-axis direction) between the first electrode ELT1 and the second electrode ELT2 may be different from a distance DB1 of the first direction (X-axis direction) between the second electrode ELT2 and the third electrode ELT3. For example, the distance DA1 of the first direction (X-axis direction) between the first electrode ELT1 and the second electrode ELT2 may be greater than the distance DB1 of the first direction (X-axis direction) between the second electrode ELT2 and the third electrode ELT3.

For example, the distance DB1 of the first direction (X-axis direction) between the second electrode ELT2 and the third electrode ELT3 may be substantially the same as a distance DB2 of the first direction (X-axis direction) between the third electrode ELT3 and the fourth electrode ELT4.

For example, the distance DB2 of the first direction (X-axis direction) between the third electrode ELT3 and the fourth electrode ELT4 may be different from a distance DA2 of the first direction (X-axis direction) between the fourth electrode ELT4 and the fifth electrode ELT5. For example, the distance DB2 of the first direction (X-axis direction) between the third electrode ELT3 and the fourth electrode ELT4 may be less than the distance DA2 of the first direction (X-axis direction) between the fourth electrode ELT4 and the fifth electrode ELT5.

For example, the distance DA1 of the first direction (X-axis direction) between the first electrode ELT1 and the second electrode ELT2 may be substantially the same as the distance DA2 of the first direction (X-axis direction) between the fourth electrode ELT4 and the fifth electrode ELT5.

For example, widths of the first to fifth electrodes ELT1, ELT2, ELT3, ELT4, and ELT5 may be substantially the same. For example, a width WE1 of the first direction (X-axis direction) of the first electrode ELT1, a width WE2 of the first direction (X-axis direction) of the second electrode ELT2, a width WE3 of the first direction (X-axis direction) of the third electrode ELT3, a width WE4 of the first direction (X-axis direction) of the fourth electrode ELT4, and a width WE5 of the first direction (X-axis direction) of the fifth electrode ELT5 may be substantially the same. However, the disclosure is not limited thereto, and the widths of the first to fifth electrodes ELT1, ELT2, ELT3, ELT4, and ELT5 may be variously changed according to an embodiment.

A space in which the first to fifth electrodes ELT1, ELT2, ELT3, ELT4, and ELT5 are separated may be defined as alignment regions R1, R2, R3, and R4. For example, a separation space between the first electrode ELT1 and the second electrode ELT2 may be defined as a first alignment region R1, a separation space between the second electrode ELT2 and the third electrode ELT3 may be defined as a second alignment region R2, a separation space between the third electrode ELT3 and the fourth electrode ELT4 may be defined as a third alignment region R3, and a separation space between the fourth electrode ELT4 and the fifth electrode ELT5 may be defined as a fourth alignment region R4. A plurality of light emitting elements LD may be disposed between the first to fifth electrodes ELT1, ELT2, ELT3, ELT4, and ELT5, for example, in the first to fourth alignment regions R1, R2, R3, and R4. For example, the light emitting elements LD may include a first light emitting element LD1 disposed in the first alignment region R1, a second light emitting element LD2 disposed in the second alignment region R2, a third light emitting element LD3 disposed in the third alignment region R3, and a fourth light emitting element LD4 disposed in the fourth alignment region R4. The first to fourth light emitting elements LD1, LD2, LD3, and LD4 may be electrically connected with each other in series and/or in parallel to form the light source unit LSU of the pixel PXL.

The distances DB1 and DB2 of the first direction (X-axis direction) between adjacent center alignment electrodes ELTB may be different from the distances DA1 and DA2 of the first direction (X-axis direction) between the center alignment electrode ELTB and the outer alignment electrode ELTA. For example, the distances DB1 and DB2 of the first direction (X-axis direction) between the adjacent center alignment electrodes ELTB may be less than the distances DA1 and DA2 of the first direction (X-axis direction) between the center alignment electrode ELTB and the outer alignment electrode ELTA. In the process of aligning the light emitting elements LD between the outer alignment electrodes ELTA and the center alignment electrodes ELTB, even though a relatively strong electric field is formed at the outer point compared to the central point in the emission area EMA, a uniform electric field may be formed by compensating for an electric field difference in the emission area EMA by forming a narrower distance between the center alignment electrodes ELTB. Therefore, the alignment degree of the light emitting elements LD and the uniformity of light emission of each pixel PXL may be improved as described above. According to an embodiment, the distances DB1 and DB2 of the first direction (X-axis direction) between adjacent center alignment electrodes ELTB may be less than the length WL of the first direction (X-axis direction) of the light emitting element LD. For example, the distances DA1 and DA2 of the first direction (X-axis direction) between the center alignment electrode ELTB and the outer alignment electrode ELTA may be less than the length WL of the first direction (X-axis direction) of the light emitting element LD.

According to an embodiment, each pixel PXL may further include first to fifth contact electrodes CNE1, CNE2, CNE3, CNE4, and CNE5 for electrically connecting the first to fifth electrodes ELT1, ELT2, ELT3, ELT4, and ELT5 and the first to fourth light emitting elements LD1, LD2, LD3, and LD4.

The first contact electrode CNE1 may electrically connect one or an end of the first light emitting element LD1 and the first alignment electrode ELT1. The second contact electrode CNE2 may electrically connect another end of the first light emitting element LD1 and the second alignment electrode ELT2. For example, the second contact electrode CNE2 may be electrically connected to one or an end of the second light emitting element LD2. The third contact electrode CNE3 may electrically connect another end of the second light emitting element LD2 and the third alignment electrode ELT3. For example, the third contact electrode CNE3 may be electrically connected to one or an end of the third light emitting element LD3. The fourth contact electrode CNE4 may electrically connect another end of the third light emitting element LD3 and the fourth alignment electrode ELT4. For example, the fourth contact electrode CNE4 may be electrically connected to one or an end of the fourth light emitting element LD4. The fifth contact electrode CNE5 may electrically connect another end of the fourth light emitting element LD4 and the fifth alignment electrode ELT5. However, a contact relationship between the first to fifth contact electrodes CNE1, CNE2, CNE3, CNE4, and CNE5, the first to fifth electrodes ELT1, ELT2, ELT3, ELT4, and ELT5, and the first to fourth light emitting elements LD1, LD2, LD3, and LD4 is not limited to the structure illustrated in FIG. 14, and may be variously changed according to an electrical connection relationship between the first to fourth light emitting elements LD1, LD2, LD3, and LD4.

In an embodiment, widths of the first to fifth contact electrodes CNE1, CNE2, CNE3, CNE4, and CNE5 may be different from each other. For example, a width WC1 of the first direction (X-axis direction) of the first contact electrode CNE1 may be greater than a width WC2 of the first direction (X-axis direction) of the second contact electrode CNE2. The width WC2 of the first direction (X-axis direction) of the second contact electrode CNE2 may be greater than a width WC3 of the first direction (X-axis direction) of the third contact electrode CNE3. The width WC3 of the first direction (X-axis direction) of the third contact electrode CNE3 may be less than a width WC4 of the first direction (X-axis direction) of the fourth contact electrode CNE4. The width WC4 of the first direction (X-axis direction) of the fourth contact electrode CNE4 may be substantially the same as the width WC2 of the first direction (X-axis direction) of the second contact electrode CNE2. For example, the width WC4 of the first direction (X-axis direction) of the fourth contact electrode CNE4 may be less than a width WC5 of the first direction (X-axis direction) of the fifth contact electrode CNE5. The width WC5 of the first direction (X-axis direction) of the fifth contact electrode CNE5 may be substantially the same as the width WC1 of the first direction (X-axis direction) of the first contact electrode CNE1. A distance DC of the first direction (X-axis direction) between the first to fifth contact electrodes CNE1, CNE2, CNE3, CNE4, and CNE5 may be substantially the same, but is limited thereto. As described above, in a case that the contact electrodes CNE1, CNE2, CNE3, CNE4, and CNE5 are spaced apart in the substantially same distance and the distance between the alignment electrodes ELTA and ELTB is differently formed, a center line of the contact electrodes CNE1, CNE2, CNE3, CNE4, and CNE5 and a center line of the alignment electrodes ELTA and ELTB may not coincide. However, the disclosure is not limited thereto, and the widths and the distances of the first to fifth contact electrodes CNE1, CNE2, CNE3, CNE4, and CNE5 may be variously changed according to an embodiment.

Figure 15:
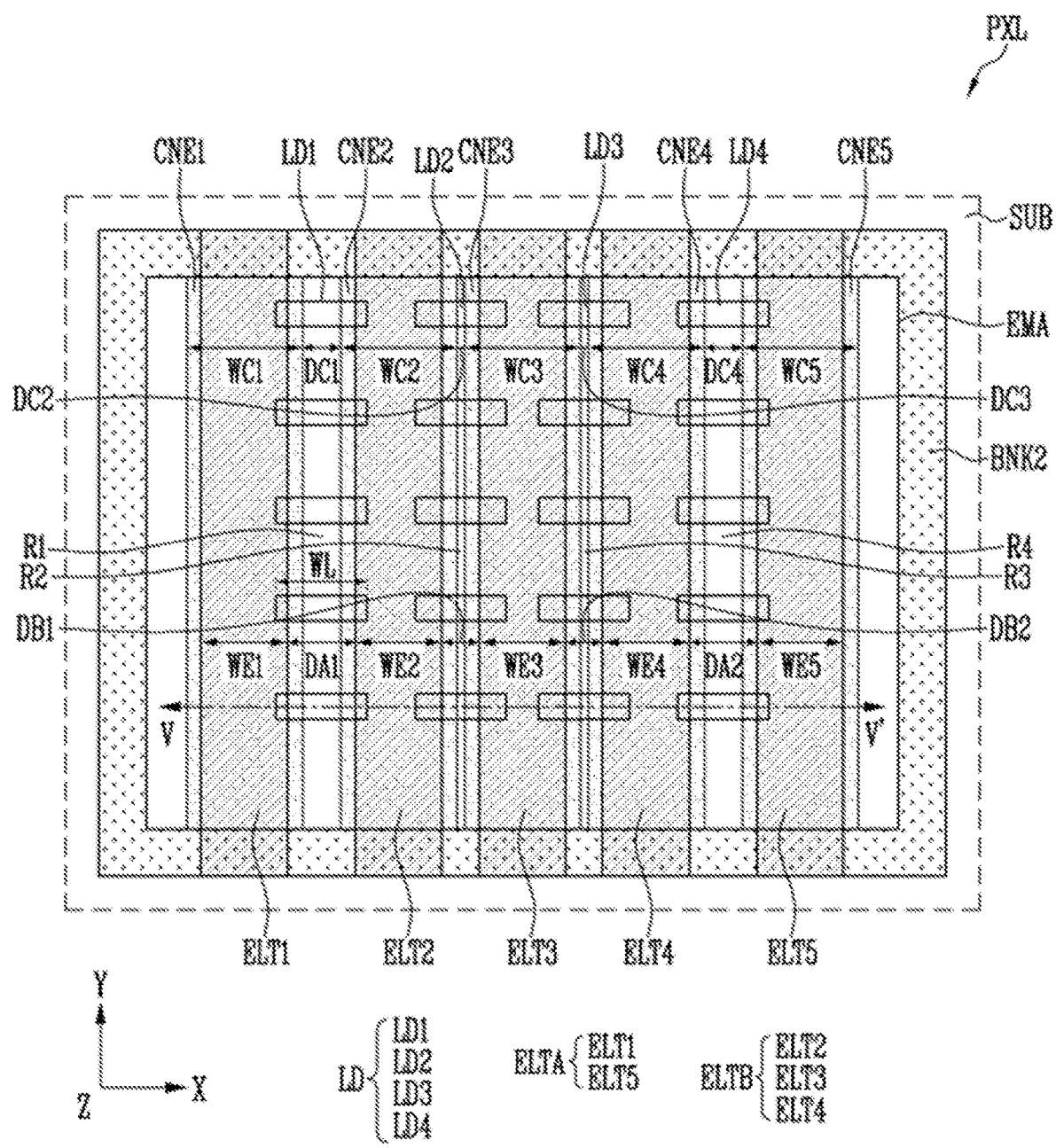
FIG. 15 is a plan view illustrating a pixel according to an embodiment.
Figure 16:
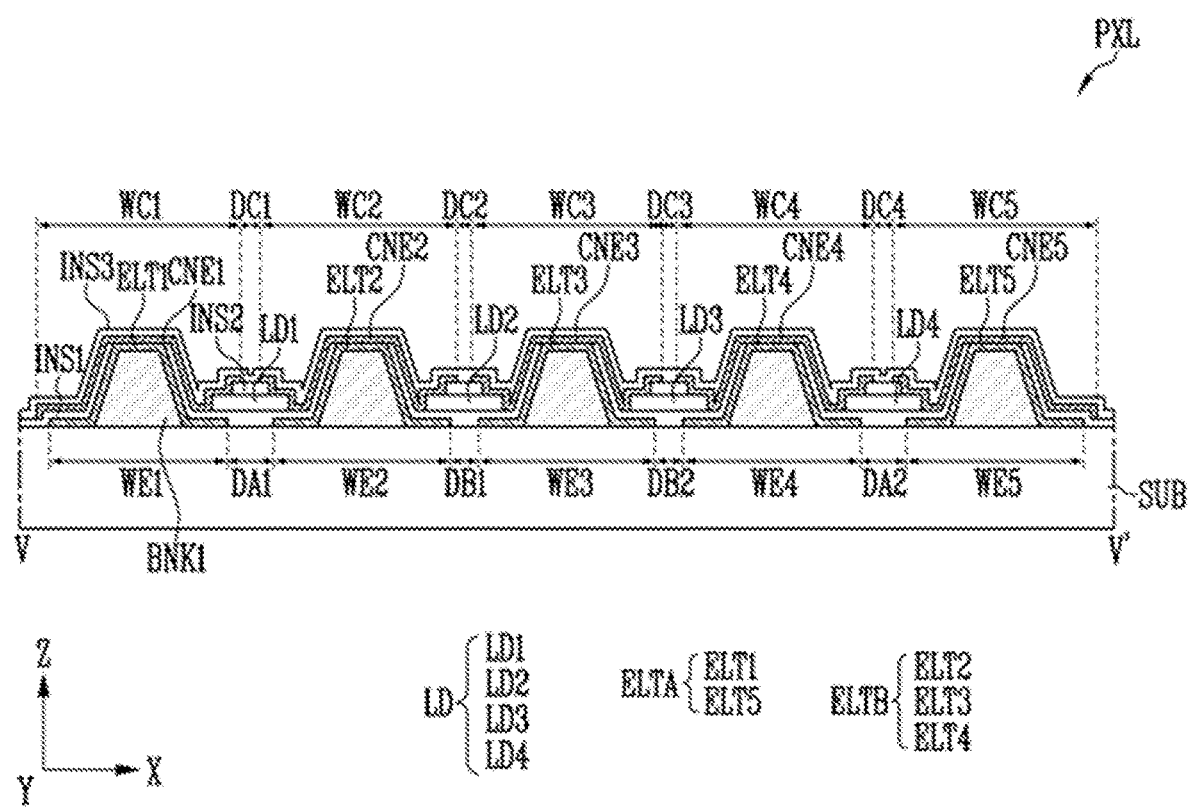
FIG. 16 is a schematic cross-sectional view taken along a line V-V' of FIG. 15.

FIG. 15 is a plan view illustrating a pixel according to an embodiment. FIG. 16 is a schematic cross-sectional view taken along a line V-V' of FIG. 15.

Referring to FIGS. 15 and 16, the display device according to an embodiment may be different from an embodiment of FIGS. 13 and 14 in that the widths of the first to fifth contact electrodes CNE1, CNE2, CNE3, CNE4, and CNE5 are substantially the same.

By way of example, the width WC1 of the first direction (X-axis direction) of the first contact electrode CNE1, the width WC2 of the first direction (X-axis direction) of the second contact electrode CNE2, the width WC3 of the first direction (X-axis direction) of the third contact electrode CNE3, the width WC4 of the first direction (X-axis direction) of the fourth contact electrode CNE4, and the width WC5 of the first direction (X-axis direction) of the fifth contact electrode CNE5 may be substantially the same.

For example, distances between the first to fifth contact electrodes CNE1, CNE2, CNE3, CNE4, and CNE5 may be different from each other. For example, a distance DC1 of the first direction (X-axis direction) between the first contact electrode CNE1 and the second contact electrode CNE2 may be greater than a distance DC2 of the first direction (X-axis direction) between the second contact electrode CNE2 and the third contact electrode CNE3. For example, the distance DC2 of the first direction (X-axis direction) between the second contact electrode CNE2 and the third contact electrode CNE3 may be substantially the same as a distance DC3 of the first direction (X-axis direction) between the third contact electrode CNE3 and the fourth contact electrode CNE4. For example, the distance DC3 of the first direction (X-axis direction) between the third contact electrode CNE3 and the fourth contact electrode CNE4 may be less than a distance DC4 of the first direction (X-axis direction) between the fourth contact electrode CNE4 and the fifth contact electrode CNE5. For example, the distance DC4 of the first direction (X-axis direction) between the fourth contact electrode CNE4 and the fifth contact electrode CNE5 may be substantially the same as the distance DC1 of the first direction (X-axis direction) between the first contact electrode CNE1 and the second contact electrode CNE2.

In a case of an embodiment, the widths and the distances of the contact electrodes CNE1, CNE2, CNE3, CNE4, and CNE5 may be formed so that center lines of the first to fifth contact electrodes CNE1, CNE2, CNE3, CNE4, and CNE5 coincide with center lines of the first to fifth alignment electrodes ELT1, ELT2, ELT3, ELT4, and ELT5, respectively. However, the disclosure is not limited thereto, and the widths and the distances of the first to fifth contact electrodes CNE1, CNE2, CNE3, CNE4, and CNE5 may be variously changed according to an embodiment.

Those skilled in the art will understand that the disclosure may be implemented in a modified form without departing from the above-described disclosure. Therefore, the disclosed methods should be considered in a descriptive sense only and not for purposes of limitation. The scope of the disclosure is shown in the claims and in the above description, and all differences within the scope will be construed as being included in the disclosure.

What is claimed is:

1. A display device comprising:
a plurality of pixels including alignment electrodes and light emitting elements disposed between the alignment electrodes; and
the alignment electrodes including outer alignment electrodes and center alignment electrodes disposed between the outer alignment electrodes,
wherein a distance between the center alignment electrodes is different from a distance between the center alignment electrodes and the outer alignment electrodes.

2. The display device according to claim 1, wherein the distance between the center alignment electrodes is less than the distance between the center alignment electrodes and the outer alignment electrodes.

3. The display device according to claim 1, wherein
the outer alignment electrodes include a first outer alignment electrode and a second outer alignment electrode spaced apart from each other, the center alignment electrodes being disposed between the first outer alignment electrode and the second outer alignment electrode, and
the center alignment electrodes include:
a first center alignment electrode adjacent to the first outer alignment electrode; and
a second center alignment electrode adjacent to the second outer alignment electrode.

4. The display device according to claim 3, wherein a distance between the first outer alignment electrode and the first center alignment electrode is substantially same as a distance between the second outer alignment electrode and the second center alignment electrode.

5. The display device according to claim 3, wherein a distance between the first center alignment electrode and the first outer alignment electrode is greater than a distance between the first center alignment electrode and the second center alignment electrode.

6. The display device according to claim 3, wherein a distance between the second center alignment electrode and the second outer alignment electrode is greater than a distance between the second center alignment electrode and the first center alignment electrode.

7. The display device according to claim 3, further comprising:
a bank partitioning an emission area of the plurality of pixels.

8. The display device according to claim 7, wherein the first outer alignment electrode is disposed between the bank and the first center alignment electrode.

9. The display device according to claim 7, wherein the second outer alignment electrode is disposed between the bank and the second center alignment electrode.

10. The display device according to claim 1, further comprising:
contact electrodes electrically connecting the alignment electrodes and the light emitting elements.

11. The display device according to claim 1, wherein
the outer alignment electrodes include a first outer alignment electrode and a second outer alignment electrode spaced apart from each other, the center alignment electrodes being disposed between the first outer alignment electrode and the second outer alignment electrode, and
the center alignment electrodes include:
a first center alignment electrode adjacent to the first outer alignment electrode;
a second center alignment electrode adjacent to the second outer alignment electrode; and
a third center alignment electrode disposed between the first center alignment electrode and the second center alignment electrode.

12. The display device according to claim 11, wherein a distance between the first outer alignment electrode and the first center alignment electrode is substantially same as a distance between the second outer alignment electrode and the third center alignment electrode.

13. The display device according to claim 11, wherein a distance between the first outer alignment electrode and the first center alignment electrode is greater than a distance between the first center alignment electrode and the second center alignment electrode.

14. The display device according to claim 13, wherein the distance between the first center alignment electrode and the second center alignment electrode is substantially same as a distance between the second center alignment electrode and the third center alignment electrode.

15. A display device comprising:
a plurality of pixels each comprising:
a first alignment electrode, a second alignment electrode, a third alignment electrode, and a fourth alignment electrode disposed on a substrate; and
light emitting elements disposed between the first alignment electrode, the second alignment electrode, the third alignment electrode, and the fourth alignment electrode,
wherein a distance between the first alignment electrode and the second alignment electrode is different from a distance between the second alignment electrode and the third alignment electrode.

16. The display device according to claim 15, wherein the distance between the second alignment electrode and the third alignment electrode is different from a distance between the third alignment electrode and the fourth alignment electrode.

17. The display device according to claim 15, wherein the distance between the first alignment electrode and the second alignment electrode is greater than the distance between the second alignment electrode and the third alignment electrode.

18. The display device according to claim 15, wherein a distance between the third alignment electrode and the fourth alignment electrode is greater than the distance between the second alignment electrode and the third alignment electrode.

19. The display device according to claim 15, wherein the distance between the first alignment electrode and the second alignment electrode is substantially same as a distance between the third alignment electrode and the fourth alignment electrode.

20. The display device according to claim 15, further comprising:
a bank partitioning an emission area of the plurality of pixels.

21. The display device according to claim 20, wherein the first alignment electrode is disposed between the bank and the second alignment electrode.

22. The display device according to claim 20, wherein the fourth alignment electrode is disposed between the bank and the third alignment electrode.

23. The display device according to claim 15, wherein the light emitting elements comprise:
- a first light emitting element disposed between the first alignment electrode and the second alignment electrode;
- a second light emitting element disposed between the second alignment electrode and the third alignment electrode; and
- a third light emitting element disposed between the third alignment electrode and the fourth alignment electrode.

24. The display device according to claim 23, further comprising:
- a first contact electrode electrically connecting an end of the first light emitting element and the first alignment electrode; and
- a second contact electrode electrically connecting another end of the first light emitting element and the second alignment electrode.

25. The display device according to claim 15, further comprising:
- a first contact electrode overlapping the first alignment electrode;
- a second contact electrode overlapping the second alignment electrode; and
- a third contact electrode overlapping the third alignment electrode,
- wherein a width of the first contact electrode is greater than a width of the second contact electrode.

26. The display device according to claim 25, wherein a distance between the first contact electrode and the second contact electrode is substantially same as a distance between the second contact electrode and the third contact electrode.

27. The display device according to claim 15, further comprising:
- a first contact electrode overlapping the first alignment electrode;
- a second contact electrode overlapping the second alignment electrode; and
- a third contact electrode overlapping the third alignment electrode,
- wherein a width of the first contact electrode is substantially same as a width of the second contact electrode.

28. The display device according to claim 27, wherein a distance between the first contact electrode and the second contact electrode is greater than a distance between the second contact electrode and the third contact electrode.

* * * * *